United States Patent [19]
Ohno et al.

[11] Patent Number: 5,404,019
[45] Date of Patent: Apr. 4, 1995

[54] CHARGED PARTICLE EXPOSURE SYSTEM HAVING A CAPABILITY OF CHECKING THE SHAPE OF A CHARGED PARTICLE BEAM USED FOR EXPOSURE

[75] Inventors: Manabu Ohno, Kasugai; Akio Yamada, Kawasaki, both of Japan

[73] Assignees: Fujitsu Limited, Kawasaki; Fujitsu VLSI Limited, Kasugai, both of Japan

[21] Appl. No.: 157,415

[22] Filed: Nov. 26, 1993

[30] Foreign Application Priority Data

Nov. 26, 1992 [JP] Japan .................................. 4-317106

[51] Int. Cl.$^6$ .......................................... H01J 37/304
[52] U.S. Cl. ........................ 250/492.23; 250/492.22; 250/397
[58] Field of Search ................ 250/492.22, 492.23, 250/492.2, 491.1, 397

[56] References Cited

U.S. PATENT DOCUMENTS

| | | | |
|---|---|---|---|
| 4,647,782 | 3/1987 | Wada et al. | 250/492.22 |
| 5,130,550 | 7/1992 | Nakamua et al. | 250/492.2 |
| 5,180,919 | 1/1993 | Oae et al. | 250/492.22 |

OTHER PUBLICATIONS

Kawamura et al., "The Application of the Correlation Method for the EB (Electron Beam) Exposure System," Proc. of 1990 Intern. Microprocess Conference, JJAP Series 4, pp. 64–67.

Primary Examiner—Jack I. Berman
Attorney, Agent, or Firm—Staas & Halsey

[57] ABSTRACT

A charged particle beam exposure system checks for the shape of the charged particle beam shaped by a mask by causing a scanning of a marker pattern provided on a substrate along a scanning path. The reflected electrons emitted from the substrate are detected, and the shape of the charged particle beam is obtained based upon the profile of the reflected electrons along the scanning path. By comparing expected pattern of the reflected charged particles, one can detect anomaly in the beam shaping aperture on the mask, wherein the step for comparing the observed pattern and the expected pattern includes a step of pattern matching for shifting the patterns with each other for seeking a minimum of unoverlapped area of the patterns. When the difference between the observed pattern and the expected pattern exceeds a threshold in the state that the unoverlapped area is minimized, an alarm produced with the information indicative of the location of the pattern wherein the threshold has been exceeded.

14 Claims, 22 Drawing Sheets

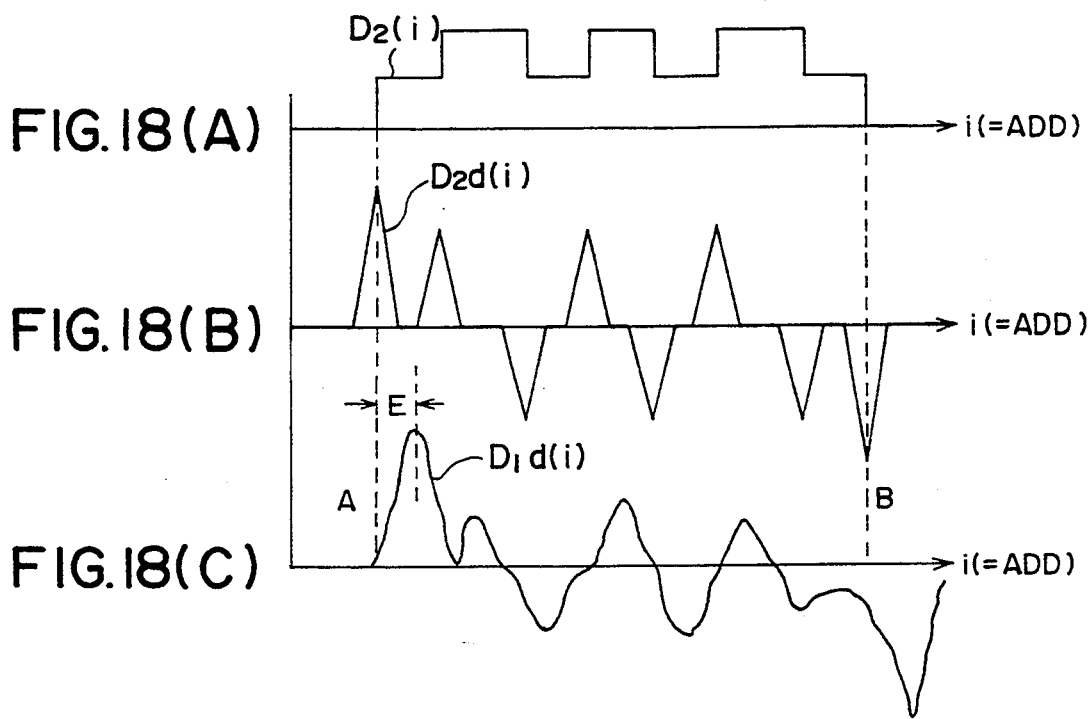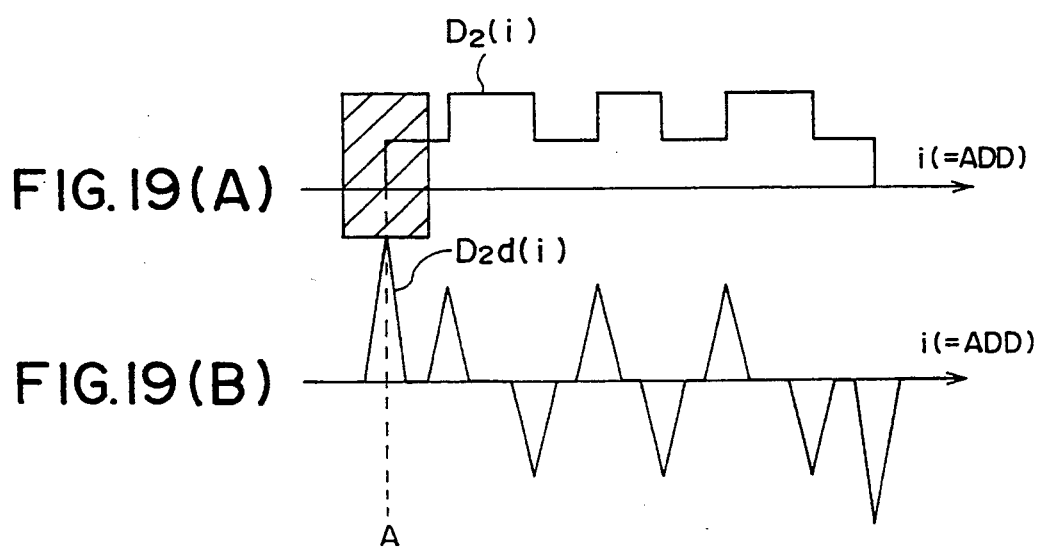

CHARGED PARTICLE EXPOSURE SYSTEM HAVING A CAPABILITY OF CHECKING THE SHAPE OF A CHARGED PARTICLE BEAM USED FOR EXPOSURE

BACKGROUND OF THE INVENTION

The present invention generally relates to fabrication of semiconductor devices and more particularly to a charged particle beam exposure system for exposing a pattern on an object such as a substrate.

In the fabrication of submicron semiconductor devices that have a pattern width typically in the order of 0.1 µm or less, use of charged beam exposure systems that employ a high energy charged particle beam such as an electron beam is essential. In the electron beam exposure system, the device pattern is exposed on the surface of a semiconductor wafer by a finely focused electron beam and one can easily achieve a pattern size of less than 0.05 µm with an alignment error of 0.02 µm or less. On the other hand, such a charged particle beam exposure system has a drawback in that the throughput of exposure is limited because of the fact that the device pattern is written by a single stroke of the focused charged particle beam, in contrast to the conventional optical exposure system that exposes a large area of the substrate by a single shot of optical radiation.

In order to overcome the foregoing problem, the inventor of the present invention has previously proposed, in the U.S. Pat. No. 5,051,556, an electron beam exposure system that patterns the beam shape of the focused electron beam according to elemental device patterns that form a part of the large and complex pattern of the semiconductor device. In this system, a mask called the block mask is provided in correspondence to the optical path of the electron beam for shaping the electron beam upon passage therethrough, and the mask is provided with a plurality of apertures shaped according to the elemental device patterns. By deflecting the electron beam to hit (i.e., be directed through) one of these apertures selectively, one can shape the electron beam according to the shape of the aperture, and the pattern having the shape of the selected aperture is exposed on the surface of the wafer or substrate. By repeating the exposure of the elemental device patterns consecutively, one can obtain the desired large and complex pattern of the semiconductor device. Such a so-called block exposure system is particularly useful in the exposure process of device patterns that include a repetition of predetermined elemental device patterns as in the case of semiconductor memories.

FIG. 1 shows the construction of the electron beam exposure system proposed previously by the inventors of the present invention.

Referring to FIG. 1, the electron beam exposure system includes an optical system 10 for carrying out the exposure by an electron beam and a control system 50 for controlling the exposure operation.

The optical system 10 includes an electron gun 14 that in turn is formed from a cathode electrode 11 for emitting thermal electrons, an anode electrode 13 for accelerating the electrons to form an electron beam and a grid electrode 12 for controlling the flow of the electrons from the cathode electrode 11 to the anode electrode 13. Thereby, the electron beam produced by the electron gun propagates generally in the direction of an object W such as a substrate held on a movable stage 35 as a divergent beam.

The divergent electron beam thus produced is then passed through a shaping aperture formed in a plate 15 to have a desired cross section and directed to travel in coincidence with a predetermined optical axis O that extends from the cathode electrode 11 to the substrate W on which a pattern is to be written. In order to achieve the desired alignment of the electron beam with respect to the optical axis O, adjustment coils 36, 37, 38 and 39 are provided along the optical axis O.

The electron beam thus shaped by the aperture plate 15 is then focused on a point P1 located on the optical axis 0 by a first electron lens 16. In correspondence to the point P1, there is provided a deflector 17 that deflects the electron beam in response to a control signal HS1 supplied thereto such that the electron beam hits a block mask to be described later.

The electron beam is then received by a second electron lens 18 that has a focal point coincident to the point P1 and is converted to a parallel electron beam. This parallel electron beam is then passed through a block mask 20 on which a plurality of apertures for shaping the electron beam are formed. Upon passage through a selected aperture, it is possible to shape the electron beam such that the electron beam has a desired cross section.

In order to address the apertures on the block mask 20, a pair of deflectors 21 and 22 are provided above the mask 20 such that the parallel electron beam is once deflected away from the optical axis O and deflected back to travel in the direction parallel to the optical axis O. Further, in order to return the electron beam in coincidence with the optical axis O, another pair of deflectors 23 and 24 are provided below the mask 20. It should be noted that the deflectors 21–24 cause the foregoing deflection and hence the addressing of the selected aperture in response to deflection control signals PS1–PS4 that are supplied thereto.

The parallel electron beam thus returned to the optical axis O is then passed through an electron lens 19 and focused at a point P2 located on the optical axis O. The electron beam is then passed through a demagnification optical system, including an electron lens 26 and another electron lens 29, and focused on the wafer W by an objective lens 32. Thereby, the image of the selected aperture on the mask 20 is projected on the upper surface of the wafer W.

In the objective lens 32, various coils and deflectors such as a dynamic focusing coil 30 and a dynamic astigmatic coil 31 are provided for focusing correction and astigmatic correction. Further, there are provided deflectors 33 and 34 that deflect the focused electron beam on the wafer W such that the electron beam moves over the wafer W, wherein the deflector 33 causes a moving of the beam spot for a distance of about 2 mm × 2 mm in the maximum, while the deflector 34 is used to deflect the electron beam within the area of about 100 µm × 100 µm. Furthermore, a refocusing coil 28 for additional focusing control is provided above the electron lens 29.

In order to control the turning on and turning off of the electron beam on the wafer W, a blanking aperture plate 27 is provided between the electron lens 26 and the electron lens 29 for passing the electron beam through a blanking aperture 27a that is formed therein in coincidence with the optical axis O. The blanking aperture 27a has a reduced diameter and the plate 27 interrupts the electron beam when the electron beam is deflected away from the optical axis O. Thereby, the electron beam disappears from the surface of the wafer W.

In order to effect such a turning-on and turning-off of the electron beam, a blanking deflector 25 is provided between the lens 19 and the plate 27, and the blanking deflector 25 deflects the electron beam away from the optical axis O in response to a blanking control signal SB supplied thereto.

Next, the control system 50 for controlling the optical system 10 will be described.

Referring to FIG. 1 again, the control system 50 includes a magnetic storage device 51 that stores various design data of the semiconductor device or integrated circuit to be formed on the wafer W and a CPU 52 that controls the optical system 10. The CPU 52 reads the pattern information of the semiconductor device such as the pattern data, the positional data indicating the location on the wafer W on which the pattern data is to be written, the mask information indicating the array of the apertures on the block mask 20, etc. The pattern information and the mask information thus read out from the storage device 51 are transferred on the one hand to a data memory 54 and on the other hand to a sequence controller 62 via an interface circuit 53.

The data memory 54 stores the pattern information and the mask information and transfers the same to a pattern generator 55 that generates deflection control data PD1-PD4 in response to the pattern information and the mask information supplied thereto. The deflection control data PD1-PD4 are sent to a D/A converter 57 where they are converted to the analog deflection control signals PS1-PS4. Thereby, the selection of the apertures on the mask 20 is achieved as already described. The pattern generator 55 further produces positional data SD3 indicative of the location of the wafer W on which the exposure is to be made. The data SD3 is sent to a D/A converter 65 where it is converted to an analog signal S3 that drives the sub-deflector 34 in the objective lens 32.

The pattern generator 55 further produces correction data HD indicative of the difference in the desired pattern and the selected pattern on the mask 20 and supplies the same to a D/A converter 56 where the data HD is converted to a control signal HS1 that drives the deflector 17. In response to the control signal HS1, the electron beam is moved over the block mask 20 and additional shaping is achieved by offsetting the electron beam slightly from the selected aperture. For example, the variable shaping of the electron beam is achieved by the deflector 17. Further, the deflector 17 achieves the deflection of the electron beam in the limited area typically having a size of 500 $\mu m \times 500$ $\mu m$ with a high speed. The deflectors 21-24 are used, on the other hand, for the deflection of the electron beam for a relatively large area typically of the size of about 5 mm$\times$5 mm, though with reduced speed. Typically, the deflector 17 is constructed by an electrostatic deflector while the deflectors 21-24 are constructed by electromagnetic deflectors.

Additionally, the pattern generator 55 produces control data MKD for moving the block mask 20 and supplies the same to a mask drive mechanism 58. The mask drive mechanism 58 moves the mask 20 in response to the control data MD in a plane substantially perpendicular to the optical axis O. Thereby, the entirety of the apertures on the mask 20 can be addressed by the electron beam by moving the mask 20 such that the specified aperture moves into the area where the addressing can be achieved by the deflection of the electron beam. Further, the pattern generator 55 produces a control signal for driving the refocusing coil 28 and supplies the same to the coil 28 via a D/A converter 28. Thereby, the proper focusing on the surface of the wafer W is maintained even when the electron beam is deflected by the deflectors 33 and 34.

The pattern generator 55 produces a timing signal T for indicating execution of the exposure or waiting for the exposure. The timing signal T is supplied to a clock control circuit, or generator (GEN) 59 that in turn produces blanking control data BC for indicating the interruption of the exposure. The data BC is then supplied to a blanking control circuit 60, and the blanking control circuit 60 drives the deflector 25 via a D/A converter 61 that produces the blanking control signal SB described previously. The clock generator 59 further produces a system clock running at a predetermined rate that determines the throughput of exposure as will be described in detail later.

The sequence controller 62 detects the timing information transferred thereto from the interface circuit 53 and indicating the commencement of the exposure process, and controls the data memory 54 via the pattern generator 55 to output main deflection data MD that is supplied to a deflection control circuit 63. The deflection control circuit 63 produces main deflection control data SD2 in response to the data MD supplied thereto and supplies the data SD2 to a D/A converter 64 where the data SD2 is converted to a deflection control signal S2. This deflection control signal S2 drives the main deflector 33 in the objective lens 32. Further, the deflection control circuit 63 controls a stage position correction circuit 68 in response to the activation thereof by the sequence controller, and the stage position correction circuit 68 drives the deflector 34 via the D/A converter 56 that produces the drive signal S3 as described previously.

In cooperation with the deflection control circuit 63 and the stage position correction circuit 68, the sequence controller 62 activates a stage moving mechanism 66 for moving the stage 35 while monitoring the position of the stage 35 by a laser interferometer 67. Thereby, the exposure of a selected pattern on the mask 20 is made at any desired location on the wafer W.

FIG. 2 shows the construction of the mask 20.

Referring to FIG. 2, it will be noted that the mask 20 is provided with a number of pattern areas $E_1$-$E_9$ arranged in rows and columns and separated from each other by a pitch EL, wherein each area may have a size of typically 5 mm$\times$5 mm. Each area in turn includes a number of block areas $B_1$-$B_{36}$ arranged in rows and columns as shown in FIG. 3, wherein each block area is separated from each other by a pitch BL and includes therein an aperture for shaping the electron beam. Typically, each block area has a size of 500 $\mu m \times 500$ $\mu m$.

FIG. 4 shows an example of the shaping apertures formed in the block areas $B_a$-$B_d$ that are included in the foregoing block areas $B_1$-$B_{36}$, wherein it will be noted that the block areas $B_a$-$B_d$ carry respective apertures 20a-20g. By deflecting the electron beam selectively by the deflectors 21-24, one can direct the electron beam to hit one of these block areas as indicated in FIG. 5, wherein the hatched region 71 represents the region illuminated by the deflected electron beam. In the illustrated example, the electron beam is shaped in accordance with the cross-shaped pattern corresponding to an aperture 72a. It will also be noted that FIG. 5 shows other block apertures such as apertures 72b–72d.

In such a block exposure system, there may be a case wherein the block mask 20 carries thereon defective patterns, examples of which are shown in FIG. 6(A) or FIG. 6(B), wherein FIG. 6(A) shows a bridging of two separate patterns while FIG. 6(B) shows a deposition of a dust particle upon the pattern of the block mask 20. Although the defects shown in FIGS. 6(A) and 6(B) can be discovered by a microscopic inspection before the mask is mounted on the electron beam exposure apparatus, the defects that are formed as a result of the thermal deformation or charge-up of the mask cannot be detected by such a microscopic inspection process previously to the actual exposure process. Once the mask is dismounted from the electron beam exposure system, one the other hand, such a defect is no longer detected. One discovers the defect only after the exposure of the substrate has been completed.

SUMMARY OF THE INVENTION

Accordingly, it is a general object of the present invention to provide a novel and useful electron beam exposure system wherein the foregoing problems are eliminated.

Another and more specific object of the present invention is to provide a charged particle beam exposure system for exposing a pattern on an object by means of a shaped charged particle beam produced by shaping a charged particle beam by a beam shaping mask that carries a number of beam shaping apertures thereon, wherein one can examine the defect in the shape of the beam shaping apertures based upon the shaped charged particle beam that is radiated upon the object.

Another object of the present invention is to provide a charged particle beam exposure system for exposing a pattern on an object by a shaped charged particle beam, comprising:

beam source means for producing a charged particle beam and radiating the same toward said object along an optical axis;

beam shaping means provided on said optical axis between said beam source means and said object for shaping said charged particle beam to produce a shaped charged particle beam, said beam shaping means comprising a mask for interrupting said charged particle beam and apertures provided on said mask for passing said charged particle beam, said apertures thereby shaping said charged particle beam according to a shape of said apertures to produce said shaped charged particle beam;

deflection means for deflecting said charged particle beam so as to hit a selected beam shaping aperture on said beam shaping mask;

focusing means for focusing said shaped charged particle beam upon said object with demagnification;

a marker pattern provided on a surface of said object for reflecting said shaped charged particle beam that is radiated upon said object, with a rate different from the rest of the surface of said object;

control means for scanning said marker pattern by said shaped charged particle beam along a scanning path;

detection means for detecting reflected charged particles that are reflected from the surface of said object;

storage means for storing an expected pattern of reflected charged particles that would be emitted from said object when said marker pattern is scanned by said shaped charged particle beam along said scanning path;

difference means for calculating a difference between a first pattern representative of a pattern of said reflected charged particles detected by said detection means upon a scanning of said marker pattern by said charged particle beam along said scanning path and a second pattern representative of said expected pattern of said reflected charged particles stored in said storage means, said difference means producing difference data indicative of said difference;

pattern matching means supplied with said difference data for minimizing the same by shifting said first pattern with respect to said second pattern along said scanning path; and anomaly detection means supplied with said difference from said difference means for evaluating the magnitude of a residual difference indicative of said difference minimized by said pattern matching means, said anomaly detection means producing an alarm signal when the magnitude of said residual difference has exceeded a threshold value.

Another object of the present invention is to provide a method for exposing a pattern on an object by means of a focused charged particle beam, comprising the steps of:

producing a charged particle beam such that said charged particle beam travels toward said object along an optical path;

shaping said charged particle beam to form a shaped charged particle beam having a selected beam shape by passing said charged particle beam through a selected beam shaping aperture provided on a mask;

focusing said shaped charged particle beam upon said object;

deflecting said shaped charged particle beam such that said charged particle beam scans over a marker pattern provided on said object along a scanning path, said scanning path crossing said marker pattern;

detecting reflected electrons reflected from said object while causing a scanning of said charged particle beam over said marker pattern;

obtaining a first pattern indicative of a pattern of said reflected electrons obtained in said step of detecting reflected electrons along said scanning path;

obtaining a second pattern indicative of a pattern of reflected electrons that is excepted when said shaped charged particle scans said marker pattern along said scanning path;

calculating an evaluation function indicative of an area wherein said first and second patterns to not overlap with each other, by comparing said first and second patterns;

minimizing said evaluation function by shifting said second pattern with respect to said first pattern along said scanning path;

calculating a difference between said first and second patterns for said first and second patterns that are shifted with each other to minimize said evaluation function; and issuing an alarm when said difference has exceeded a predetermined threshold.

According to the present invention, one can evaluate the discrepancy between the observed pattern and the expected pattern of the reflected charged particles upon scanning of the marker pattern on the object by the shaped charged particle beam. As the pattern of the reflected charged particles represent the pattern of the shaped charged particle beam and hence the shape of the beam shaping aperture on the mask, one can detect the anomaly in the beam shaping aperture by examining the difference between the first and second patterns. Thereby, it should be noted that any apparent discrepancy caused by the positional deviation of the marker pattern with respect to an ideal position, based on which the expected pattern is predicted, of the object is corrected by the pattern matching means. Thus, by applying the threshold process in the anomaly detection mean to the residual difference as set forth above, one can detect the net anomaly that reflects the anomaly in the beam shaping aperture. Further, by detecting the magnitude of the shift of the pattern achieved in the pattern matching means, one can detect the positional deviation of the shaped charged particle beam with respect to the marker pattern on the surface of the object.

Other objects and further features of the present invention will become apparent from the following detailed description when read in conjunction with the attached drawings.

BRIEF DESCRIPTION OF THE DRAWINGS

FIGS. 18(A)–18(C) are diagrams showing the principle of a second embodiment of the present invention;

FIGS. 19(A) and 19(B) are diagrams showing a modification of the second embodiment;

DETAILED DESCRIPTION OF PREFERRED EMBODIMENTS

Figure 7:
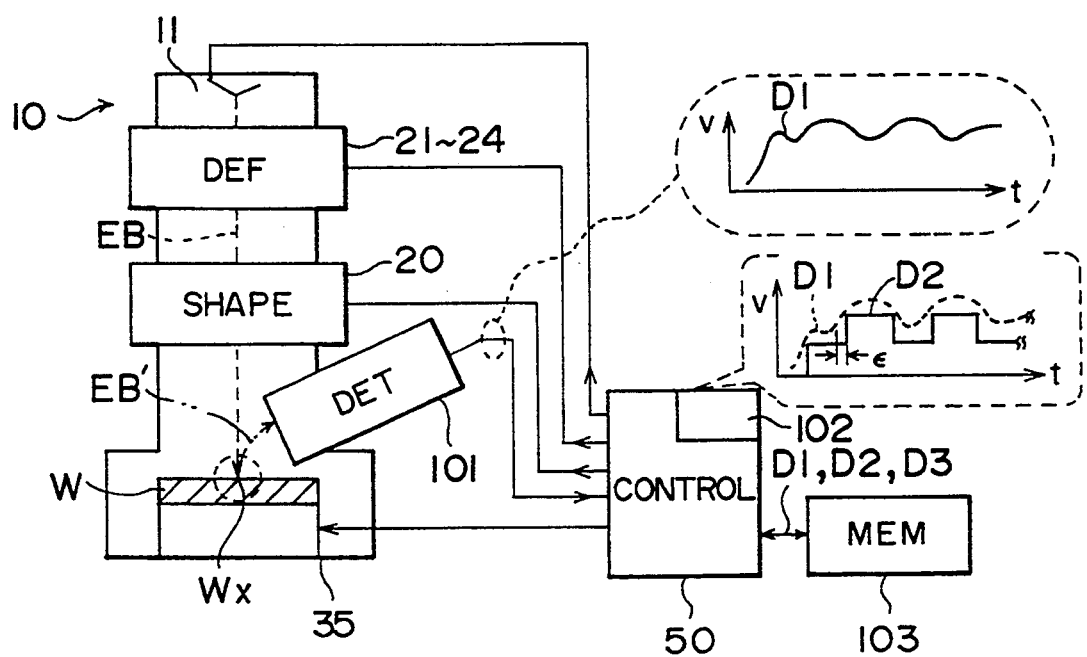
FIG. 7 is a block diagram showing the principle of the present invention.

FIG. 7 shows the principle of the present invention.

Figure 1:
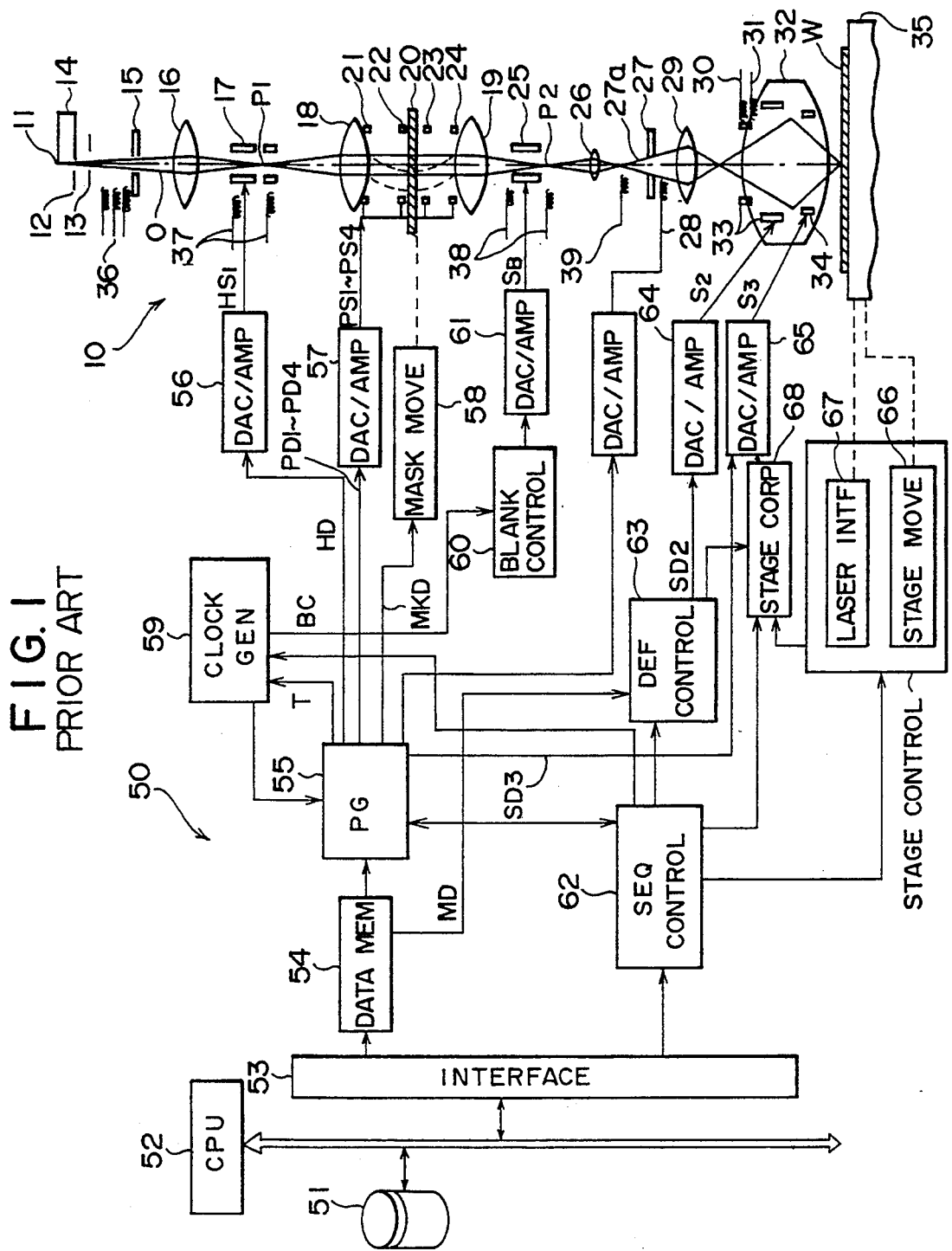
FIG. 1 is a block diagram showing the construction of an electron beam exposure system to which the present invention is applicable.
Figure 2:
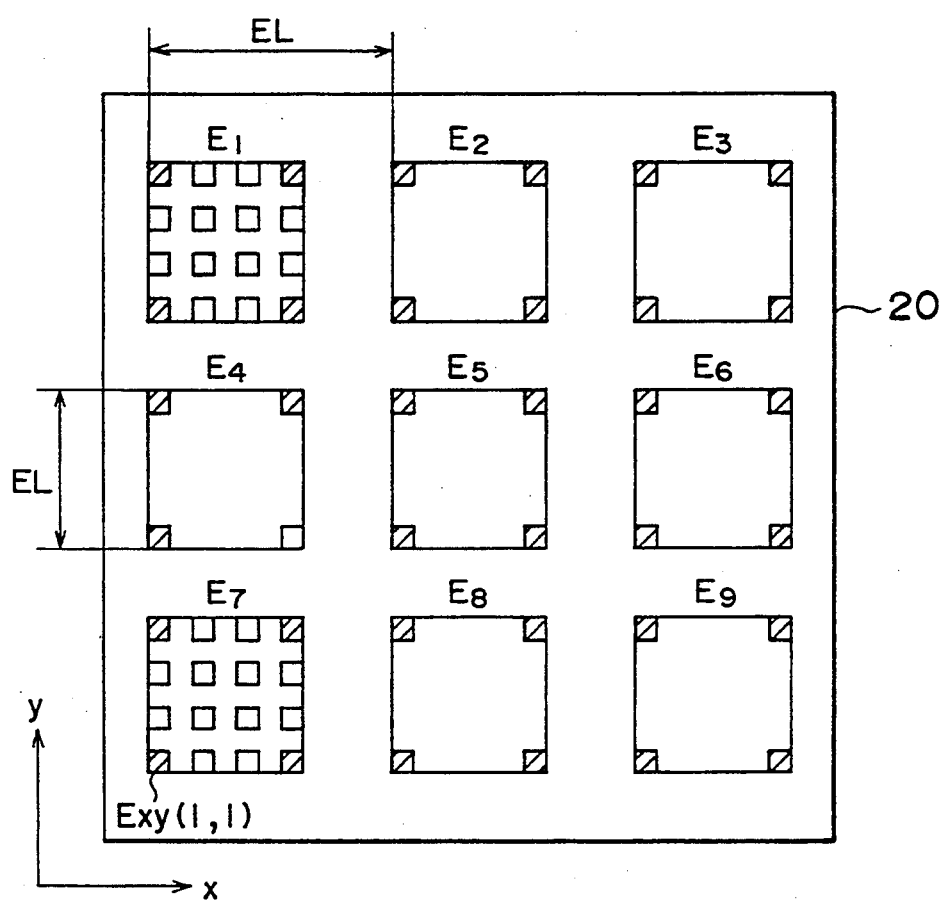
FIG. 2 is a diagram showing the construction of a block mask used in the system of FIG. 1 for shaping an electron beam.
Figure 3:
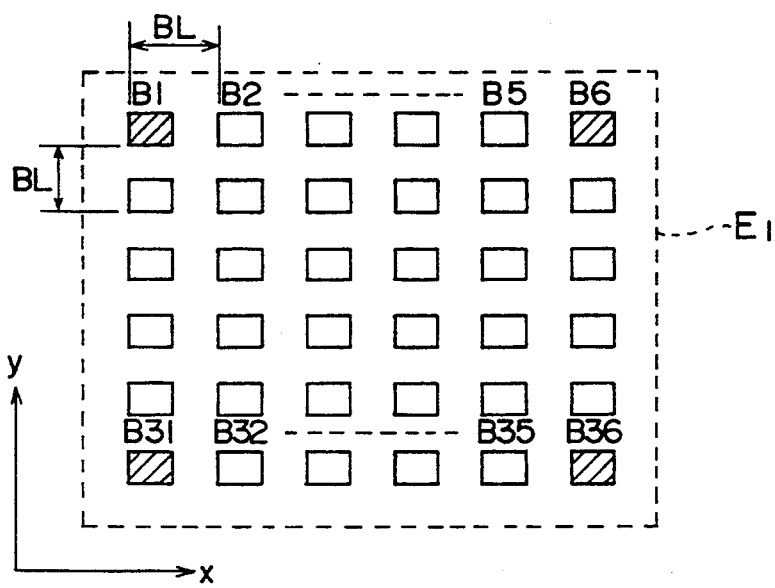
FIG. 3 is a diagram showing the construction of a pattern area that is formed in the block mask of FIG. 2 for carrying a number of pattern blocks.
Figure 4:
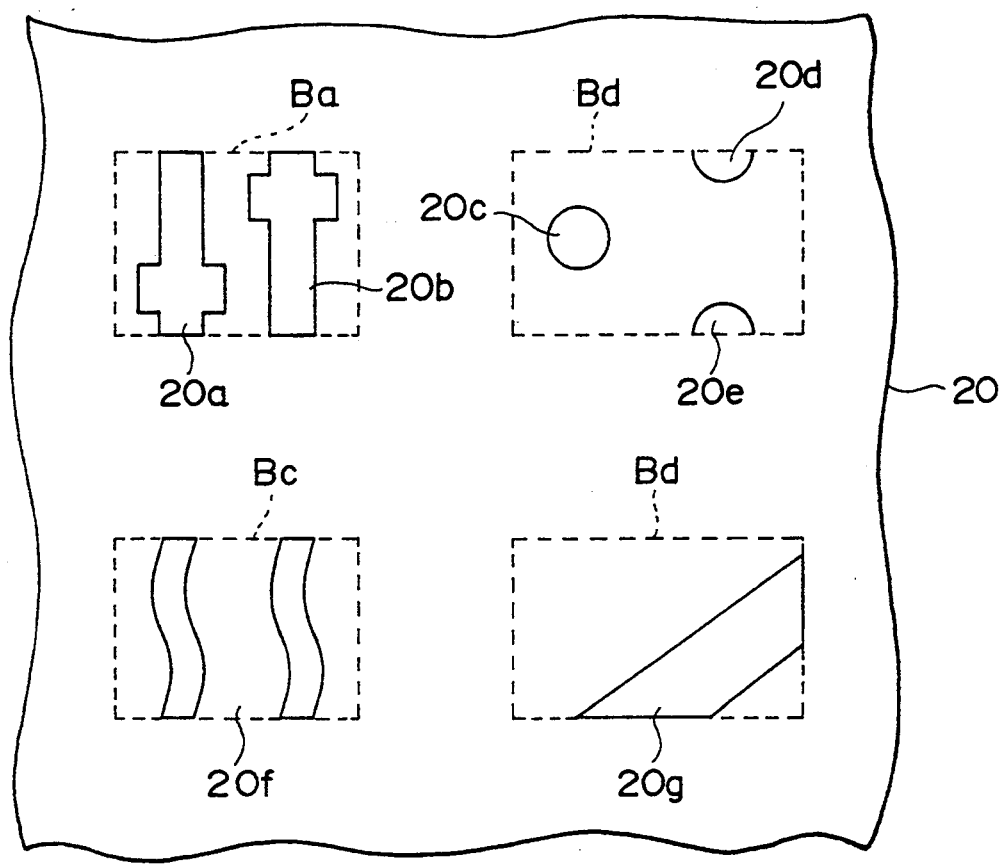
FIG. 4 is a diagram showing an example of apertures that are formed in the pattern block shown in FIG. 3.
Figure 5:
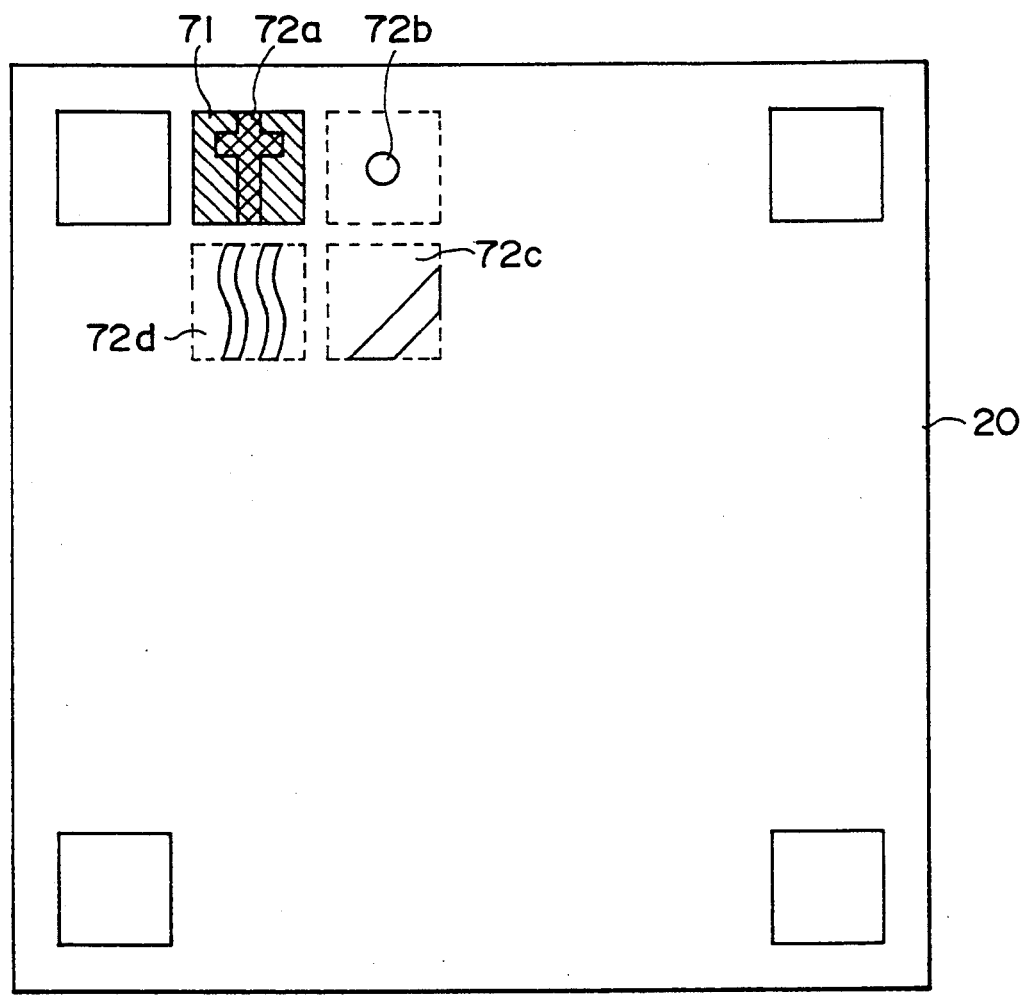
FIG. 5 is a diagram showing an example of shaping an electron beam by the apertures formed in the block mask.
Figure 6A:
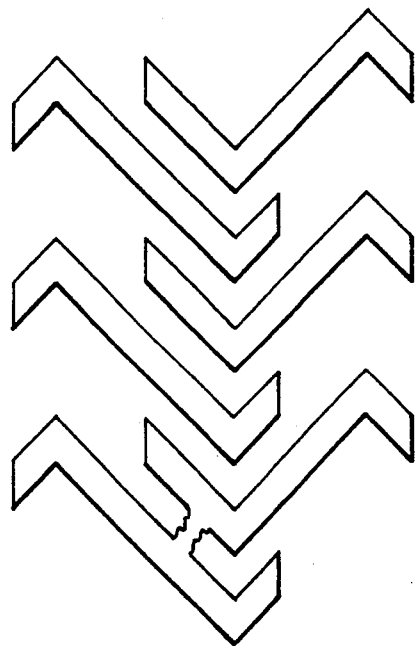
FIGS. 6(A) and 6(B) are diagrams showing examples of the defective beam shaping aperture on the block mask.
Figure 6B:
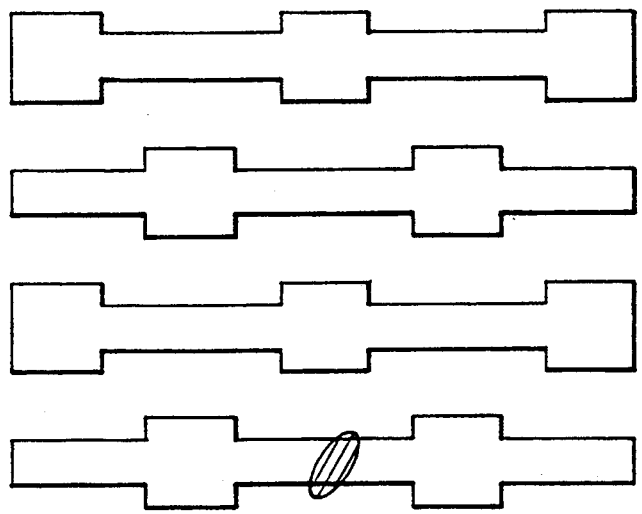

Referring to FIG. 7 showing the electron beam exposure system of FIG. 1 schematically, the electron beam designated as EB is produced by the electron beam source 11 and is shaped to have a desired beam shape by the block mask 20 under control of the deflectors 21–24. The electron beam EB thus shaped impinges upon the substrate W wherein the substrate W carries thereon a marker pattern Wx to be described later in detail. Further, there is provided a detector 101 for detecting reflected electrons EB' that are reflected from the substrate W upon irradiation of the substrate W by the electron beam EB.

In such a construction of the electron optical system 10, the electron beam EB is reflected by the substrate W with a different rate of reflectivity in correspondence to the marker pattern Wx as compared with the rest of the part of the substrate W, and the reflected electrons EB' thus formed as a result of the reflection is detected by the detector 101. Typically, the marker pattern Wx is a line or a grid formed of intersecting lines, and the scanning of the electron beam EB over the marker pattern Wx along a path that crosses the pattern Wx results in the formation of the reflected electrons EB' as indicated in FIG. 7 by $D_1$, wherein the vertical axis v represents the intensity of the reflected electrons EB' while the horizontal axis t represents the time and hence the position on the substrate W along the scanning path of the electron beam EB over the marker pattern Wx.

In the system of FIG. 7, there is provided a storage device 103 in correspondence to the storage device 51 of FIG. 1 for storing data $D_3$ indicative of the shape of the beam shaping apertures on the mask 20, and a sub-control unit 102 is provided in cooperation with the control system 50 for producing data $D_2$ indicative of the expected pattern of the reflected electrons when the electron beam EB shaped in accordance with the beam shape specified by the data $D_3$ is scanned over the marker pattern Wx. Further, the control unit 102 compares the data $D_1$ detected by the detector 101 with the data $D_2$ and applies a pattern matching process such that the overall difference between the data $D_1$ and the data $D_2$ becomes minimum. In the pattern matching process, the control unit 102 shifts the pattern for the data $D_1$ along the scanning line with respect to the data $D_2$ such that the difference between the data $D_1$ and the data $D_2$ is minimized. In correspondence to this pattern matching process, any positional deviation of the electron beam EB with respect to the marker pattern Wx is detected and compensated. Further, the control unit 102 evaluates the magnitude of the residual difference between the data $D_1$ and the data $D_2$ remaining after the pattern matching process, and produces an alarm signal indicative of anomaly in the beam shaping pattern on the mask 20 when the magnitude of the residual difference has exceeded a predetermined threshold.

Figure 8A:
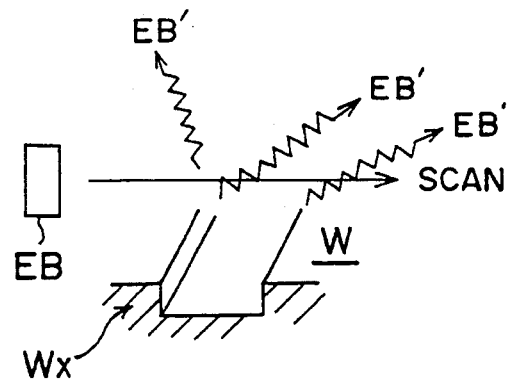
FIGS. 8(A)–8(C) are diagrams showing an example of the marker pattern formed on the substrate and the pattern of reflected electrons obtained by the marker pattern.
Figure 8B:
Figure 8C:
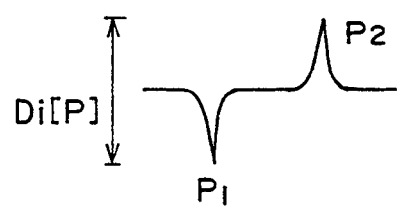

FIGS. 8(A)–8(C) show an example of the marker pattern Wx provided on the substrate W, wherein FIG. 8(A) shows that the marker pattern Wx is a groove provided on the substrate W. The groove is scanned by the shaped electron beam EB as indicated by an arrow, wherein the detector 101 detects the reflected electrons and produces a signal corresponding to the data $D_1$ as shown in FIG. 8(B). Further, one may apply a differentiation to the signal of FIG. 8(B) as shown in FIG. 8(C), wherein the signal of FIG. 8(C) is characterized by a pair of peaks $P_1$ and $P_2$ respectively corresponding to the front and rear edges of the groove Wx shown in FIG. 8(A).

Figure 9A:
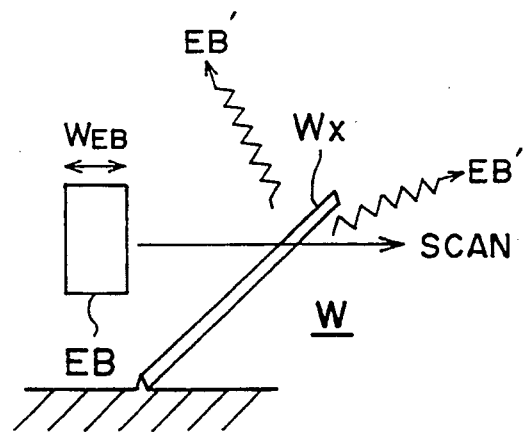
FIGS. 9(A)–9(C) are diagrams showing another example of the marker pattern and the pattern of reflected electrons obtained by such a marker pattern.
Figure 9B:
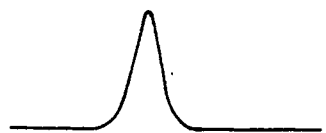
Figure 9C:
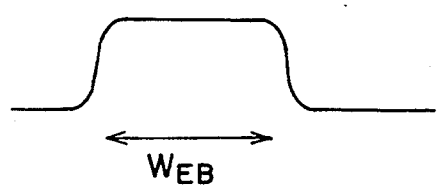

Alternatively, one may provide a ridge as the marker pattern Wx as indicated in FIG. 9(A), wherein the shaped electron beam EB scans over the ridge Wx as indicated by the arrow SCAN. In response to the radiation of the beam EB, the detector 101 produces a sharp pulse output as indicated in FIG. 9(B). By detecting the output signal of FIG. 9(B) while scanning the electron beam EB as indicated in FIG. 9(A), one obtains an output signal as shown in FIG. 9(C), wherein the signal of FIG. 9(C) has a pulse width $W_{EB}$ corresponding to the width $W_{EB}$ of the shaped electron beam EB. The date $D_1$ shown in FIG. 7 is obtained from the signal of FIG. 9(C).

Figure 10:
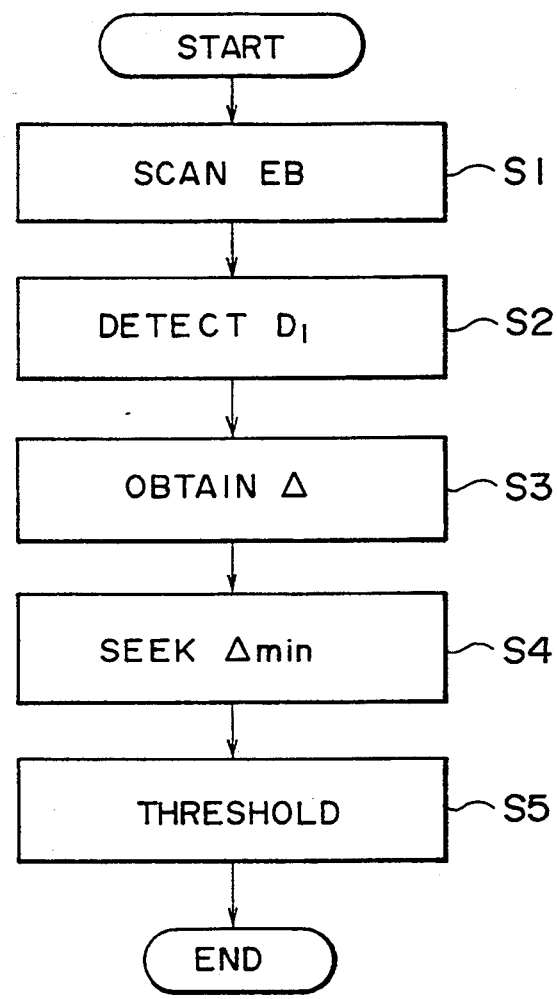
FIG. 10 is a flowchart showing the general process of the present invention.

FIG. 10 is a flowchart showing the process of the operation carried out by the system of FIG. 7.

Referring to FIG. 7, the process starts with a step S1, wherein the electron beam EB is shaped to a selected beam shape by selecting a beam shaping aperture on the mask 20, and the shaped electron beam EB is deflected by energizing the main and sub-deflectors 33 and 34 so as to scan the marker pattern Wx provided on the substrate W.

In a next step of S2, the detector 101 is activated and the reflected electrons that are emitted as a result of the scanning of the shaped electron beam EB over the marker pattern Wx are detected. Thereby, the foregoing data $D_1$ is obtained.

Next, in a step S3, the data indicative of the pattern or waveform of the reflected electrons thus detected by the detector 101 is compared with the corresponding pattern $D_2$. More specifically, the pattern for the data $D_1$ is subtracted from the expected pattern for the data $D_2$ and a difference indicative of the area for the unoverlapped portion of both patterns is calculated. Further, in order to compensate for the deviation of the beam position with respect to the substrate W, the pattern for the data $D_1$ is shifted with respect to the pattern for the data $D_2$ in a step S4 so as to minimize the difference between the data $D_1$ and the data $D_2$. As a result of the process of the steps S3 and S4, the overlapping of the pattern for the data $D_1$ and the pattern for the data $D_2$ is maximized.

Further, a step S5 is carried out wherein the magnitude of the difference thus obtained is evaluated with respect to a predetermined threshold value. It should be noted that the excessive value for the difference between the data $D_1$ and data $D_2$ that remain after the step S4 indicates the existence of a substantial difference between the shape of the electron beam EB and hence the shape of the selected aperture given by the data $D_3$. Thus, the control unit 102 produces an alarm signal when the foregoing threshold has been exceeded.

Figure 11A:
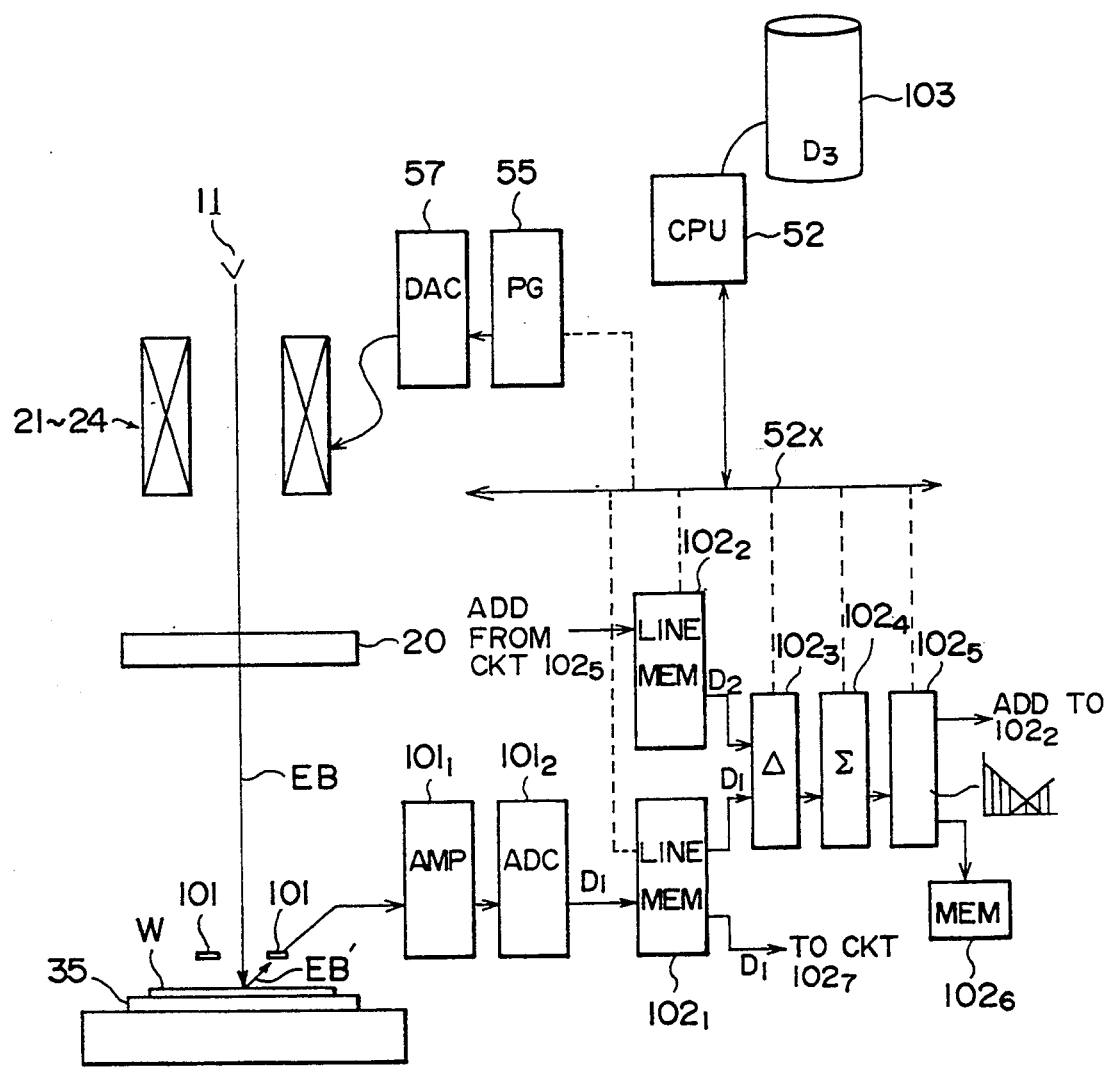
FIGS. 11(A) and 11(B) are block diagrams showing the construction of the electron beam exposure system according to a first embodiment of the present invention.
Figure 11B:
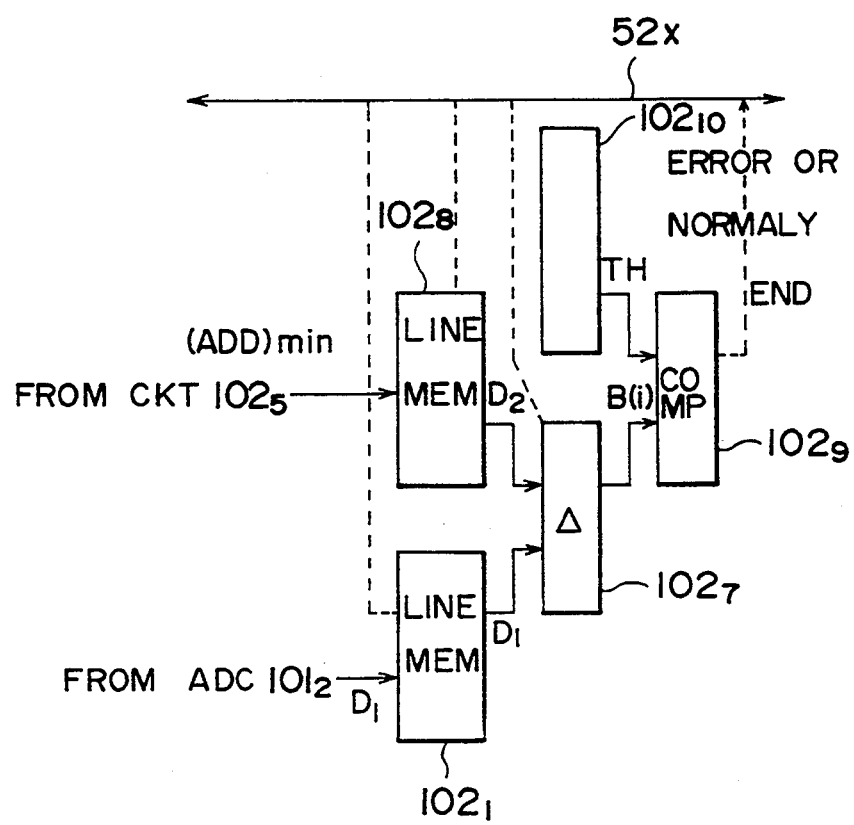

FIGS. 11(A) and 11(B) show the construction of the electron beam exposure system according to a first embodiment of the present invention.

Referring to FIG. 11(A), the output signal of the detector 101 is amplified by an amplifier $101_1$ while deflecting the electron beam EB to scan the marker pattern Wx on the substrate W as indicated in FIG. 8(A) or FIG. 9(A), and the output signal thus amplified is supplied further to an A/D converter $101_2$ for conversion to a digital signal. As a result, the A/D converter 101 produces the data $D_1$ indicative of the shape of the electron beam EB taken along the scanning path of the electron beam EB, and the data $D_1$ is stored in a line memory $102_1$, wherein the line memory $102_1$ forms a part of the control unit 102 and is controlled by the CPU 52 via a system bus 52x.

The control unit 102 further includes another line memory $102_2$ controlled also by the CPU 52, wherein the line memory $102_2$ stores therein the pattern data $D_2$ that is produced by the CPU 52 in response to the pattern data $D_3$ of the selected beam shaping aperture stored in the storage device 103. As already noted, the data $D_2$ represents the pattern of the reflected electrons expected to be obtained when the electron beam EB scans the marker pattern Wx. The data $D_1$ and the data $D_2$ thus obtained are supplied to a subtracter $102_3$ that also forms a part of the control unit 102, wherein the subtracter $102_3$ subtracts, under control of the CPU 52, the data $D_2$ from the data $D_1$ for each point on the scanning path of the electron beam, and the subtracter $102_3$ produces an output data indicative of a difference $\Delta = (D_1 - D_2)$. The output data $\Delta$ thus obtained for each point on the scanning path is supplied to an accumulator $102_4$ that accumulates the data $\Delta$ for the points on the scanning path. It will be noted that the data thus accumulated in the accumulator $102_4$ represents the area where the pattern for the data $D_1$ and the pattern for the data $D_2$ does not overlap with each other.

The data thus formed in the accumulator $102_4$ is supplied to a controller $102_5$, wherein the controller $102_5$ stores the data thus supplied in a memory $102_6$ in correspondence to a first address, and causes a shift in the pattern of the data $D_2$ with respect to the pattern of the data $D_1$ by one step along the scanning path of the electron beam EB by producing an address control signal ADD. In this state, it will be noted that the pattern for the data $D_1$ is displaced with respect to the pattern for the data $D_2$ along the direction of the scanning path of the electron beam, and the subtracter $102_3$ obtains the difference $\Delta$ for the data $D_1$ and the data $D_2$ thus displaced. Further, the accumulator $102_4$ accumulates the data $\Delta$ thus formed and holds therein the data indicative of the unoverlapped area of the patterns $D_1$ and $D_2$ thus displaced with each other. The controller $102_5$ stores the data formed in the accumulator $104_4$ in the memory $102_6$ in correspondence to a next address and causes a further displacement of the data $D_2$ with respect to the data $D_1$, and the overlap of the pattern for the data $D_1$ and the pattern for the data $D_2$ is obtained again by the subtracter $102_3$ and the accumulator $102_4$. After the data $D_2$ is displaced with respect to the data $D_1$ for the entire scanning path, the controller $102_5$ refers to the memory $102_6$ and seeks for the address $(ADD)_{min}$ of the memory $102_6$ wherein the unoverlapped area becomes minimum. It should be noted that the address $(ADD)_{min}$ of the memory $102_6$ corresponds to the number of the steps for shifting the data $D_2$ with respect to the data $D_1$ for minimizing the unoverlapped area. In other words, the data $(ADD)_{min}$ held in the memory $102_6$ represents the positional deviation of the electron beam EB on the substrate W with respect to the expected beam position. In other words, the system of FIG. 11 can also detect the deviation of the beam position on the substrate W.

The output data $D_1$ of the line memory $102_1$ is then supplied to another subtracter $102_7$ shown in FIG. 11(B), wherein the subtracter $102_7$ is supplied with ideal pattern data $D_2'$ that represents the expected pattern of the reflected electrons from a line memory $102_8$, and produces output data B indicative of the difference. The line memory $102_8$ stores the foregoing expected pattern data $D_2$ at the address $(ADD)_{min}$ detected by the controller $102_5$ in correspondence to the minimum of the unoverlapped area described above. When there exists no positional deviation of the electron beam EB, the pattern data $D_2'$ coincides with the pattern data $D_2$. In the subtracter $102_7$, the data B is calculated for each point i on the scanning line as $$B(i) = |D_1(i) - D_2'(i)| \quad (1)$$

wherein it will be noted that the point i on the scanning line corresponds to the address of the memories $102_1$ and $102_8$ similarly as before.

The data B(i) thus calculated is supplied to a comparator $102_9$, wherein the comparator $102_9$ is supplied further with a threshold value TH held in a register $102_{10}$ and examines whether or not the data B(i) exceeds the threshold TH for each point i on the scanning line. When the data B(i) exceeds the threshold TH, the comparator $102_9$ produces an alarm signal together with the data indicative of the address i of the data B(i), and the alarm signal is transmitted to the CPU 52 via the system bus 52x. Thereby, one can detect the existence of defect in the selected beam shaping aperture on the block mask 20 together with the information indicative of the location where on the selected beam shaping aperture the defect exists.

Figure 12A:
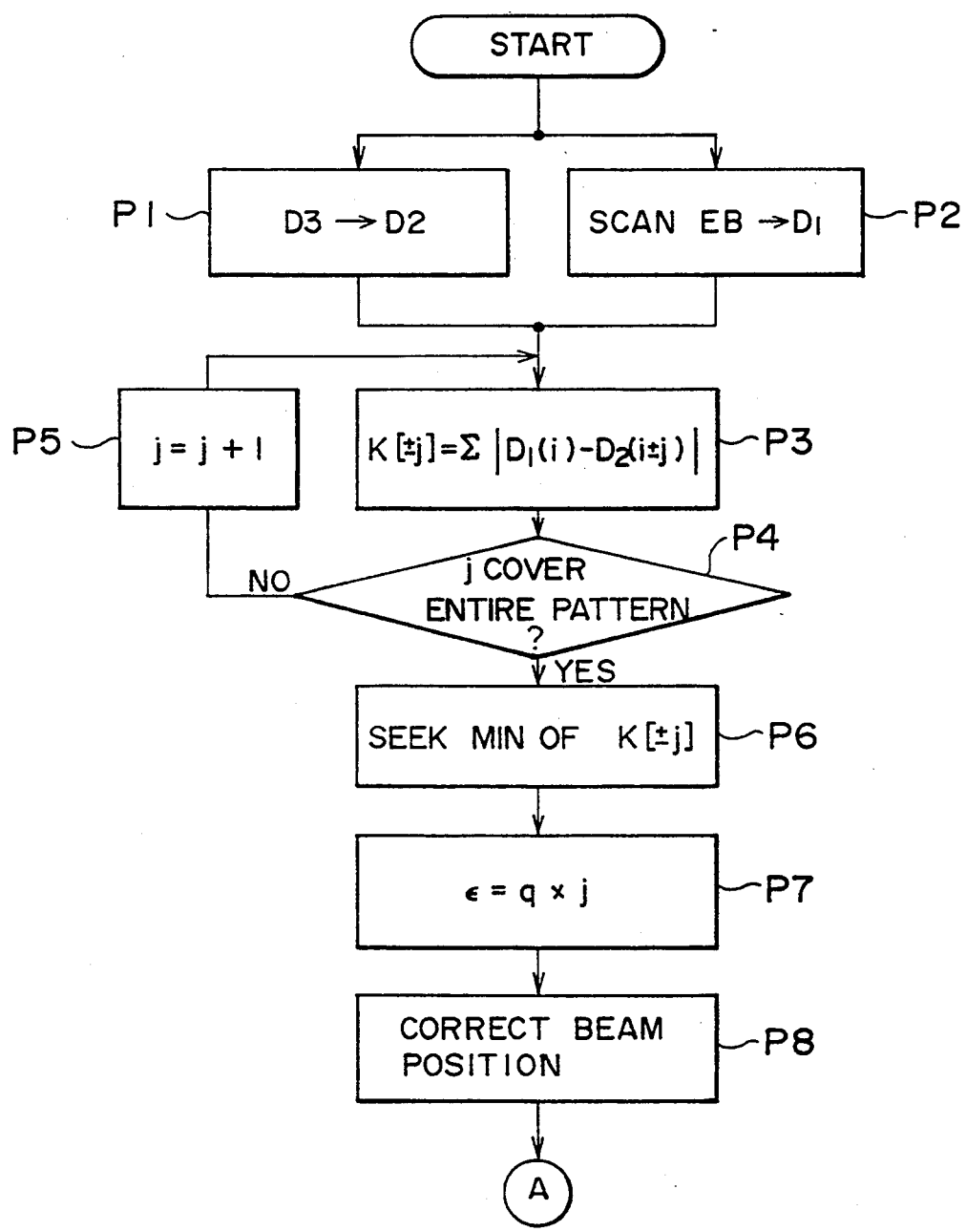
FIGS. 12(A) and 12(B) are flowcharts showing the operation of the electron beam exposure system of the first embodiment.
Figure 12B:
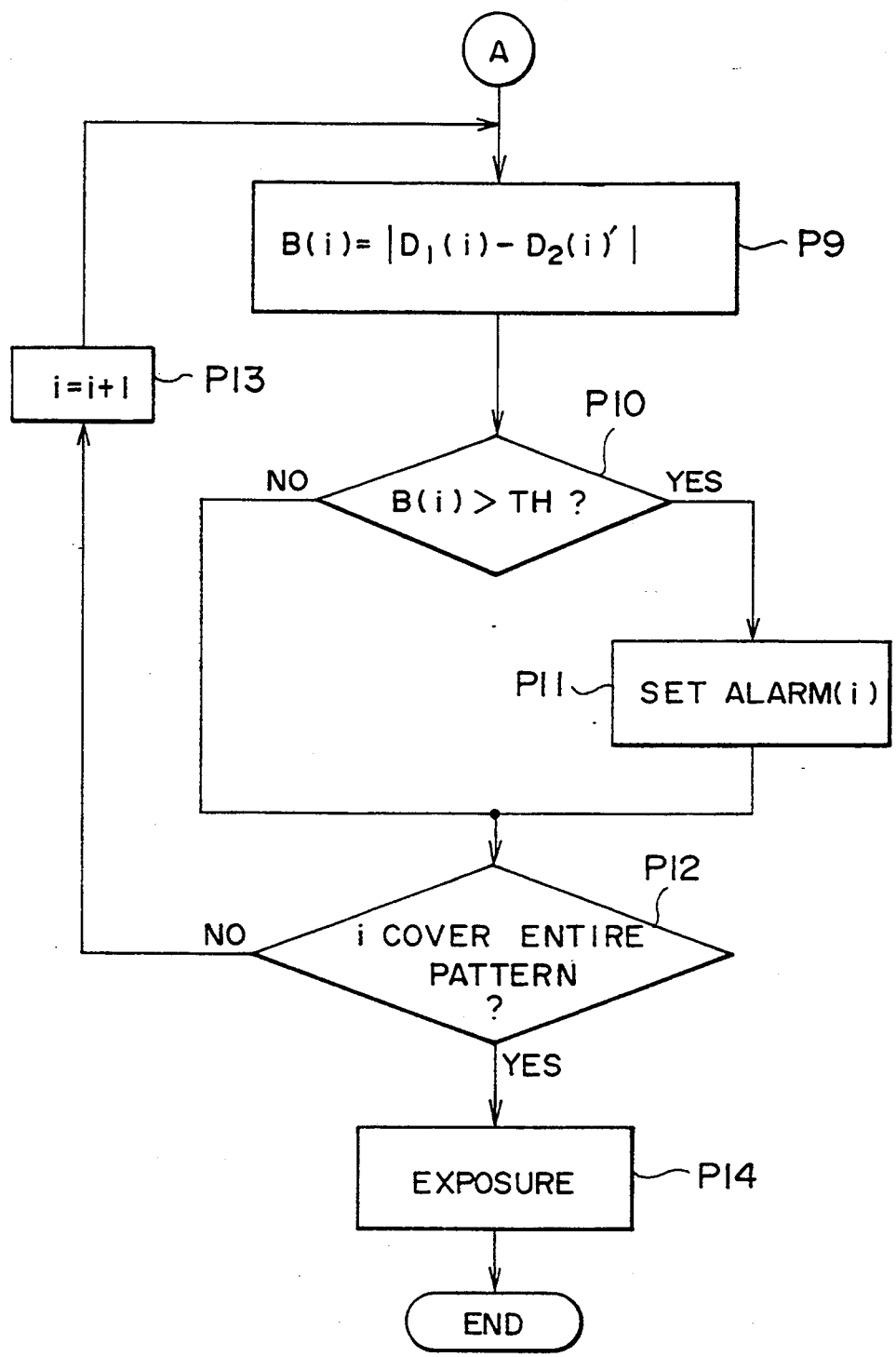

FIGS. 12(A) and 12(B) show a flowchart of the operation of the system of FIG. 11.

Referring to FIG. 12(A), the expected pattern data $D_2$ of the reflected electrons is calculated based upon the data $D_3$ in the storage device 103 in a step P1 and simultaneously a step P2 is conducted, wherein the detector 101 is activated in the step P2 for detecting the reflected electrons reflected from the marker pattern Wx on the substrate W. In the step P1, the data $D_2$ is obtained for each point i on the scanning path of the electron beam EB over the marker pattern Wx and the data $D_2$ is represented as $D_2(i)$, $i=1, 2, \ldots N$, wherein the index i takes the value 1 at one end of the scanning path and the value N at the other end. Similarly, the data $D_1$ is obtained in the step P2 for each point 1—N on the scanning path of the electron beam EB. Thus, $D_1$ is represented as $D_1(i)$, $i=1, 2, \ldots N$. The data $D_1(i)$ and $D_2(i)$ thus obtained are stored respectively in the line memories $102_1$ and $102_2$ at respective addresses specified by the index i.

Next, a step P3 is carried out, wherein the unoverlapped area for the pattern corresponding to the data $D_1$ and the pattern corresponding to the data $D_2$ is evaluated, based upon a difference between the data $D_1$ and the data $D_2$. More specifically, a difference $\Delta$ between the data $D_1$ and the data $D_2$ is calculated for each point i according to the relationship $$\Delta = D_1(i) - D_2(i), \quad i=1, 2, \ldots N \quad (2)$$

by reading out the data $D_1(i)$ and data $D_2(i)$ from the memories $102_1$ and $102_2$. Further, in the step P3, the unoverlapped area of the pattern corresponding to the data $D_1(i)$ and the pattern corresponding to the data $D_2(i)$ is calculated according to the relationship of $$K[\pm j] = \Sigma |D_1(i) - D_2(i+j)|, \quad i=1, 2, \ldots, \quad (3)$$

wherein the index j is set zero at a first iteration.

After the step P3, steps P4 and P5 are carried out for shifting the data $D_2$ with respect to the data $D_1$, wherein, in the step P4, an examination is made whether the data $D_2$ has been shifted with respect to the data $D_1$ for the entire scanning path of the electron beam. At the first iteration, the result of the step P4 is NO and the data $D_2$ is shifted by one step either in the positive direction or negative direction in the step P5. More specifically, the index j shown in Eq. (3) is increased by one step in the positive as well negative directions in the step P5, and the step P3 is carried out for calculating the evaluation function $K[\pm j]$ according to Eq. (3). After the steps P4 and P5 are repeated until the pattern for the data $D_2$ is shifter with respect to the pattern for the data $D_1$ for both directions, the result of the step P4 becomes YES and the process proceeds to a next step P6.

As a result of repeating the steps P4 and P5 for the entire points on the scanning path for both directions, one obtains the evaluation function $K[\pm j]$ that changes with the index j. Thus, the step P6 carries out a seeking process for seeking the minimum of the evaluation function $K[\pm j]$ and identifies the value of the index j that provides the minimum of the evaluation function $K[\pm j]$. As the index j thus obtained represents the number of steps the pattern for the data $D_2$ is shifted with respect to the pattern form the data $D_1$, one can obtain the positional deviation $\epsilon$ of the electron beam EB on the substrate W with respect to the expected or ideal position by merely multiplying a factor q indicative of the magnitude of beam shift achieved on the substrate W in each step according to the relationship of $$\epsilon = q \times j.$$

wherein j represents the number of the steps needed for shifting the pattern of the data $D_2$ with respect to the pattern of the data $D_1$ for minimizing the evaluation function $K[\pm j]$. Further, the position of the electron beam EB on the substrate W is corrected in a step P8 by shifting the beam by $\epsilon$.

After the step P8, a step P9 is carried out wherein the data B(i) is calculated according to Eq. (1) described before for a given index i, and the data B(i) thus obtained is examined in a step P10 as to whether or not the data B(i) exceeds the threshold TH. When the result of the step P10 is YES, indicating that an intolerable large difference exists between the observed pattern and the expected pattern of the reflected electrons, an alarm flag ALARM (i) is set in a subsequent step P11, and the process proceeds to a next step P12. On the other hand, when the result of the step P10 is NO, the process proceed directly from the step P10 to the step P12. In the step P12, a discrimination is made whether the data B(i) is obtained for all the points i on the scanning line, and if the result is NO, the next point is selected in a step P13 and the process returns to the step P9. On the other hand, when the result of the step P12 is YES, the process proceeds to a step P14 for the exposure of patterns on the substrate W.

Hereinafter, examples of the beam shape examination will be explained heretofore.

Figure 13:
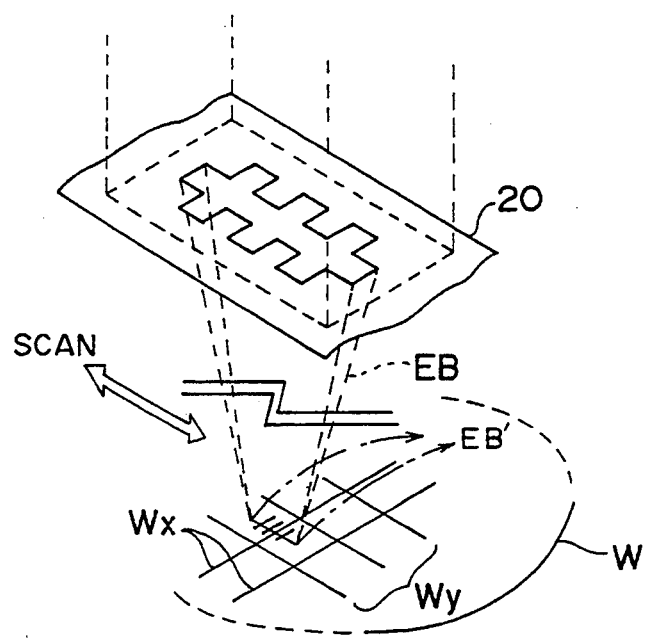
FIG. 13 is a diagram showing an example of exposure of a pattern on the substrate for detecting anomaly in the beam shaping mask.

FIG. 13 shows an example of the exposure of a selected pattern on the substrate W by means of the shaped electron beam EB, wherein the electron beam EB is shaped by the selected beam shaping aperture on the block mask 20 and is focused upon the substrate W with demagnification. In the illustrated example, the substrate W is formed with a marker pattern formed by ridges Wx and Wy forming a criss-cross pattern. Thereby, the shaped electron beam EB is scanned in the direction as indicated by an arrow SCAN such that the beam EB scans across the ridge mark Wx. In response to the scanning of the ridge mark Wx, reflected electrons are reflected as indicated by EB'.

Figure 14A:
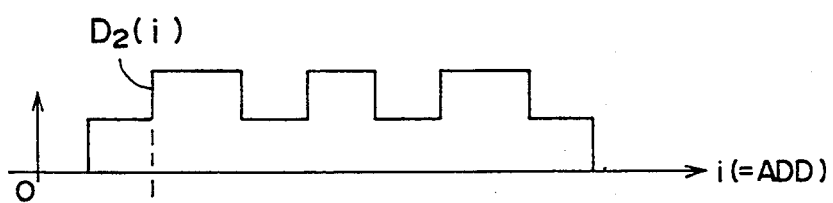
FIGS. 14(A) and 14(B) are diagrams respectively showing the theoretical and actual pattern of reflected electrons obtained when the pattern of FIG. 13 is scanned over the substrate across the marker pattern.
Figure 14B:
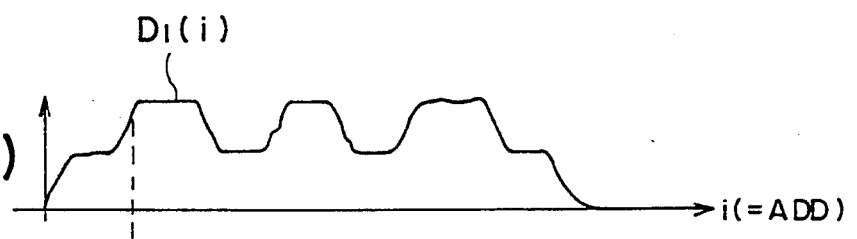

FIG. 14(A) shows the data $D_2(i)$ indicative of the expected pattern of the reflected electrons corresponding to the pattern of FIG. 13, while FIG. 14(B) shows the data $D_1(i)$ indicative of the actually detected pattern of the reflected electrons EB'. In both of FIGS. 14(A) and 14(B), the vertical axis represents the intensity of the reflected electrons while the horizontal axis represents the index i corresponding to the sampling points defined on the scanning path of the electron beam EB. The index i further corresponds to the address of the memories $102_1$ and $102_2$ in which the data $D_1$ and data $D_2$ are stored.

In the state of FIGS. 14(A) and 14(B), it will be noted that the pattern for the data $D_1(i)$ has a shape generally corresponding to the expected pattern of the data $D_2(i)$ except that the pattern for the data $D_1(i)$ is shifted to the left with respect to the pattern for the data $D_2(i)$.

Figure 15A:
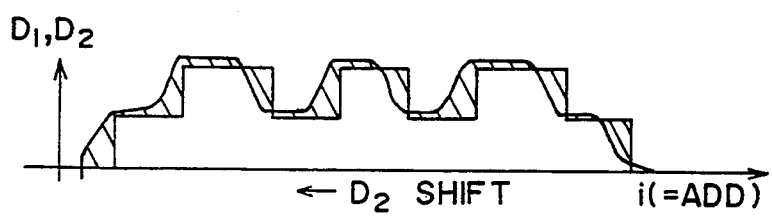
FIGS. 15(A)–15(C) are diagrams showing the pattern matching process achieved in the first embodiment.
Figure 15B:
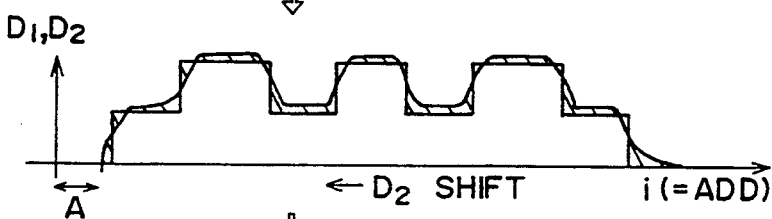
Figure 15C:
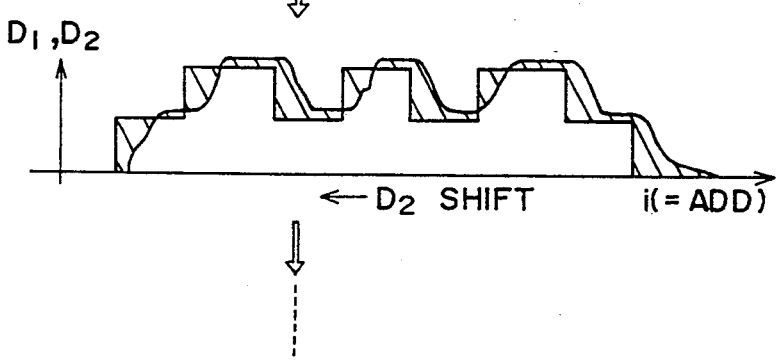

FIG. 15(A)–15(C) show the pattern matching process conducted in the step P3 of FIG. 12(A) wherein FIG. 15(A) shows a state wherein there is a displacement in the pattern $D_1(i)$ and the pattern $D_2(i)$. As a result of the displacement, there exists a substantial unoverlapped area as indicated by hatching. In the state of FIG. 15(B), on the other hand, the data $D_2(i)$ is shifted to the left with respect to the data $D_1(i)$ so as to reduce the unoverlapped area. Further, FIG. 15(C) shows a state wherein the data $D_2(i)$ is shifted further to the left with respect to the data $D_1(i)$. In this case, it will be noted that the unoverlapped area increased as a result of the excessive shifting of the data. In FIGS. 15(A)–15(C), it will be noted that the unoverlapped area illustrated by the hatching represents the evaluation function $K[\pm j]$.

Figure 16:
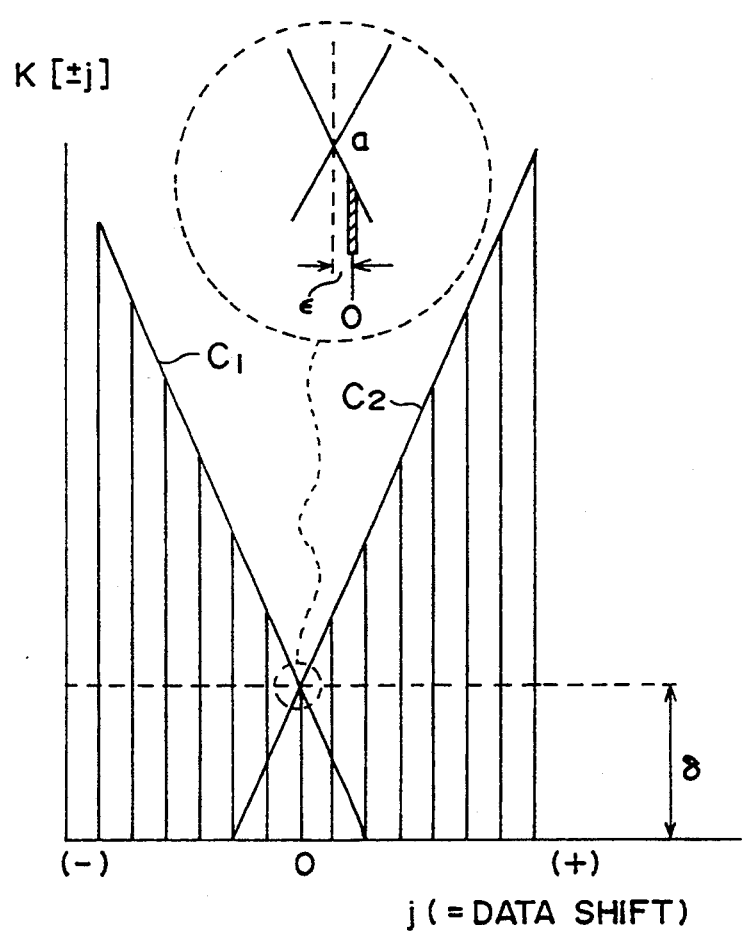
FIG. 16 is a diagram showing the process for seeking the minimum of an evaluation function indicative of the unoverlapped area of patterns obtained in the pattern matching process.

FIG. 16 shows the process of the step P6 for seeking the minimum of the evaluation function $K[\pm j]$. As shown in FIG. 16, the evaluation function $K[\pm j]$ is obtained for various values of the index j, wherein the evaluation function changes generally linearly with the index j as indicated by lines $c_1$ and $c_2$. The minimum of the evaluation function is given by the point of intersection of the lines $c_1$ and $c_2$. In the illustrated example, the intersection of the line $c_1$ and $c_2$ is formed with a slight offset to the left with respect to the origin defined as j=0, as indicated in the enlarged diagram illustrated within FIG. 16. Based upon the offset thus defected, one can evaluate the beam offset $\epsilon$ as indicated.

In the first embodiment described heretofore, the anomaly in the pattern of the shaped electron beam is detected by evaluating the difference B(i) for each point i on the scanning line as indicated in Eq. (1). Thereby, the anomaly of the beam shaping aperture is detected simultaneously with the information about the portion of the beam shaping aperture that contains the defect. On the other hand, one may detect the anomaly by comparing the residue $\delta$ of the evaluation function defined in FIG. 16 with a threshold. As the parameter $\delta$ is defined for the beam shaping aperture, one cannot detect which part of the aperture contains the defect when the parameter $\delta$ is used for detecting the anomaly. On the other hand, one can eliminate the process associated to FIG. 12(B) when the parameter $\delta$ is used for the detection of the anomaly.

Figure 17A:
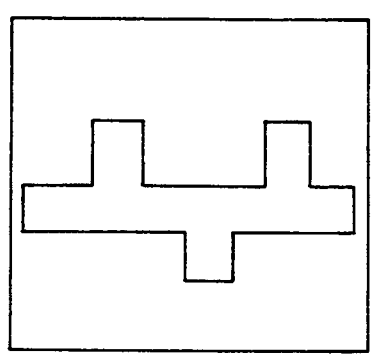
FIGS. 17(A)–17(C) are diagrams showing another example of the exposure of pattern on the substrate for detecting anomaly in the beam shaping mask.
Figure 17B:
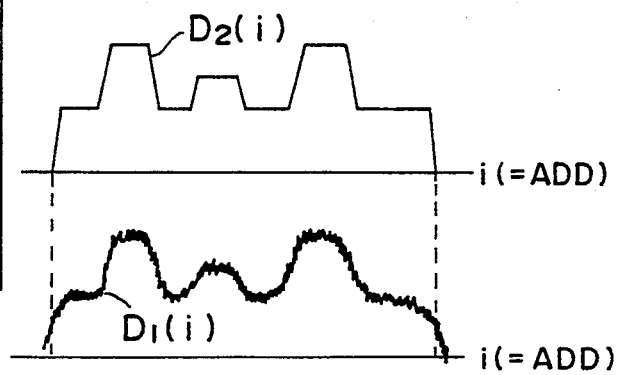
Figure 17C:
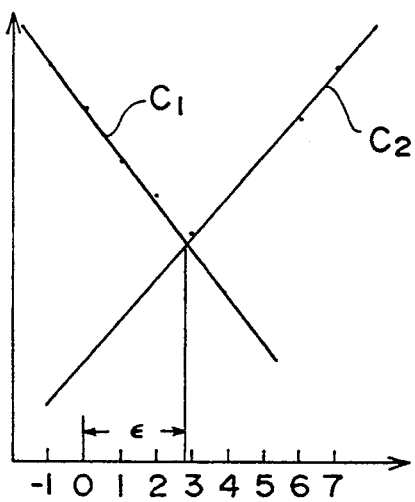

FIGS. 17(A)–17(C) show another example of the exposure performed by the shaped electron beam, wherein FIG. 17(A) shows the pattern of the selected beam shaping aperture on the block mask 20, while FIG. 17(B) shows the observed pattern $D_1$ and the expected pattern $D_2(i)$ of the reflected electrons. As will be noted in FIG. 17(B), the waveform for the data $D_1(i)$ contains substantial noise. In order to achieve the examination of the beam shape properly under the existence of noise in the data $D_1(i)$, one may employ a least square curve fitting process as shown in FIG. 17(C) for determining the lines $c_1$ and $c_2$. Thereby, a reliable detection is achieved for the intersection of the lines $c_1$ and $c_2$ and hence the determination of the offset $\epsilon$.

Next, a second embodiment of the present invention will be described.

In the first embodiment described heretofore, it will be noted that the pattern matching process carried out in the step P3 of FIG. 12(A) compares the data $D_1(i)$ and the data $D_2(i)$ for the entire range of the scanning path. Thereby the process requires a substantial time such as 0.7 seconds. In order to reduce the time necessary for the pattern matching, the present embodiment employs a differentiation of the data $D_1(i)$ and $D_2(i)$.

FIG. 18(A) shows the data $D_2(i)$ indicative of the expected pattern of the reflected electrons EB', while FIG. 18(B) shows data $D_{2d}(i)$ indicative of the differentiation of the data $D_2(i)$, wherein A and B indicate both ends of the scanning path. A similar, though more broad pattern is obtained as a result of the differentiation of the data $D_1(i)$ as data $D_{1d}(i)$ as shown in FIG. 18(C).

In the present embodiment, the pattern matching is achieved first with a coarse precision by detecting a predominant peak of the data $D_{2d}(i)$ such as the one formed at the edge A as well as a corresponding predominant peak of the data $D_{1d}(i)$ and comparing the difference E in the position of the peaks thus detected. Once the coarse difference E is thus detected, the address of the data $D_2(i)$ in the memory $102_2$ is shifted one step by one step with respect to the address of the data $D_1(i)$ in the memory $102_1$ so as to eliminate the difference between $D_1(i)$ and $D_2(i)$, and the evaluation function $K[\pm j]$ is calculated while shifting the data $D_2(i)$ with respect to the data $D_1(i)$ stepwise similarly to the first embodiment. Thereby, as the address of the data $D_2(i)$ is already shifted such that the pattern of the data $D_2$ generally coincide with the pattern of the data $D_1(i)$, the range for the step-by-step shifting of the data $D_2(i)$ with respect to the data $D_1(i)$ for obtaining the evaluation function $K[\pm j]$ is substantially reduced, and the time needed for achieving the desired pattern matching is substantially reduced.

In the process for obtaining the evaluation function $K_D[\pm j]$, one may use the differential data $D_{1d}(i)$ and $D_{2d}(i)$ in place of the data $D_1(i)$ and $D_2(i)$. In this case, the evaluation function $K[+j]$ is defined as $$K_D[\pm j] = \Sigma |D_{1d}(i) - D_{2d}(i \pm j)|.$$

When using the differential data $D_{1d}(i)$ and $D_{2d}(i)$ for the calculation of the evaluation function $K_D[\pm j]$, one can reduce the time needed for calculation further, by carrying out the pattern matching only with respect to selected predominant peaks such as the one corresponding to the edge of the scanning path shown in FIG. 19(A) by shading. It should be noted that FIG. 19(A) shows the data $D_2(i)$ while FIG. 19(B) shows the differential pattern $D_{2d}(i)$ of the data $D_2(i)$.

Figure 20:
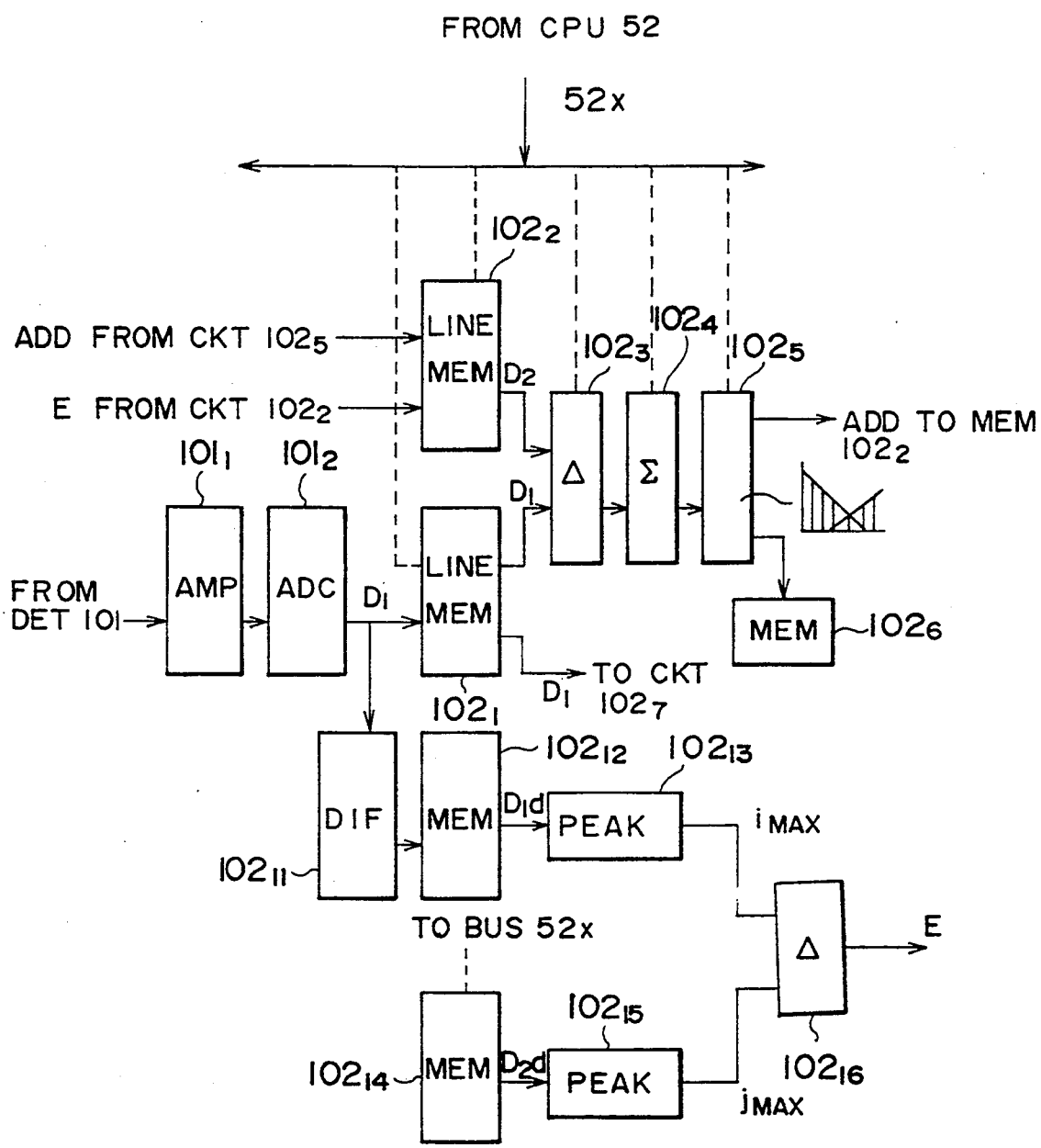
FIG. 20 is a block diagram showing the construction of the electron beam exposure system used in the second embodiment.

FIG. 20 shows the hardware construction of the electron beam exposure system according to the second embodiment, wherein FIG. 20 shows a part of the system corresponding to FIG. 11(A) of the first embodiment.

Referring to FIG. 20, the system includes further a differential circuit $102_{11}$ supplied with the data $D_1(i)$ from the A/D converter $101_2$ for producing the differential data $D_{1d}(i)$ by differentiating the data $D_1(i)$, wherein the differential circuit $102_{11}$ stores the differential data $D_{1d}(i)$ thus obtained in a line memory $102_{12}$. The data $D_{1d}(i)$ thus stored in the line memory $102_{12}$ is read out by a peak selection circuit $102_{13}$ that selects the predominant peak located at the edge A or B of the electron beam scanning path. Thereby, the circuit $102_{13}$ produces output data $i_{MAX}$ indicative of the position and hence the address of the predominant peak in the memory $102_{12}$ thus detected. Further, there is provided another line memory $102_{14}$ for storing the differential data $D_{2d}(i)$ of the expected pattern data $D_{2d}(i)$ supplied from the CPU 52 via a bus 52x, and a peak selection circuit $102_{15}$ similar to the peak selection circuit $102_{13}$ is provided for selecting the predominant peak corresponding to the edge A or B of the scanning path of the electron beam. Thereby, the circuit $102_{15}$ produces output data $j_{MAX}$ indicative of the position and hence the address of the predominant peak in the memory $102_{14}$. The data $i_{MAX}$ and the data $j_{MAX}$ are then supplied to a subtracter $102_{16}$, wherein the subtracter $102_{16}$ produces the foregoing coarse difference E according to the relationship of $$E = j_{MAX} - i_{MAX}$$

and supplied the data E thus obtained to the line memory $102_2$ for shifting the address of the data stored therein. The rest of the system of FIG. 20 is substantially identical with the system of FIG. 11(A) and further description thereof will be omitted. It should be noted that the system of FIG. 20 includes also the parts corresponding to FIG. 11(B) although not illustrated.

When using the evaluation function $K_D[\pm j]$, it will be noted that one can use the construction of FIGS. 11(A) and 11(B) except that data $D_{1d}(i)$ and $D_{2d}(i)$ are used in place of the data $D_1(i)$ and $D_2(i)$ in the circuits $102_3$–$102_5$. As such a modification is obvious, description of the system will be omitted.

Next, a third embodiment of the present invention will be described.

First, the problem addressed by the third embodiment will be described with reference to FIG. 21.

Figure 21:
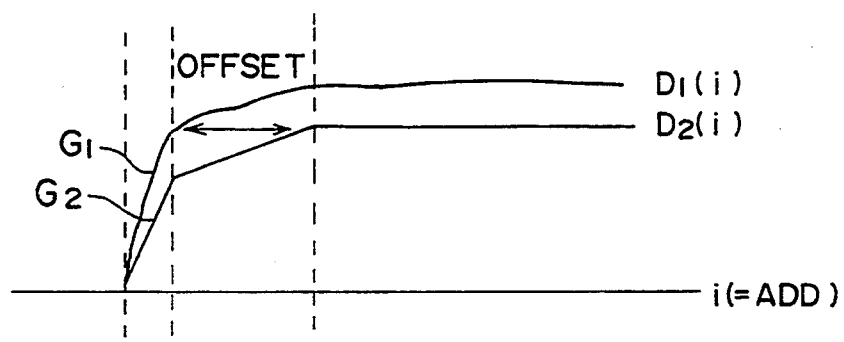
FIG. 21 is a diagram showing the principle of a third embodiment of the present invention.
Figure 22A:
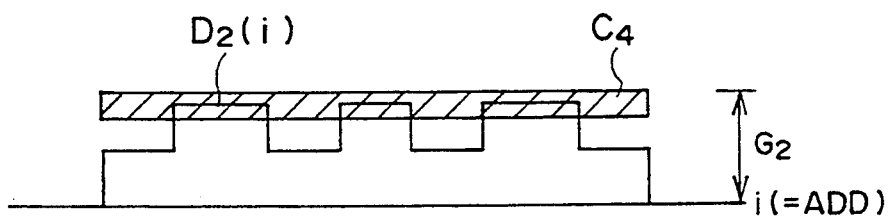
FIGS. 22(A) and 22(B) are other diagrams showing the principle of the third embodiment.
Figure 22B:
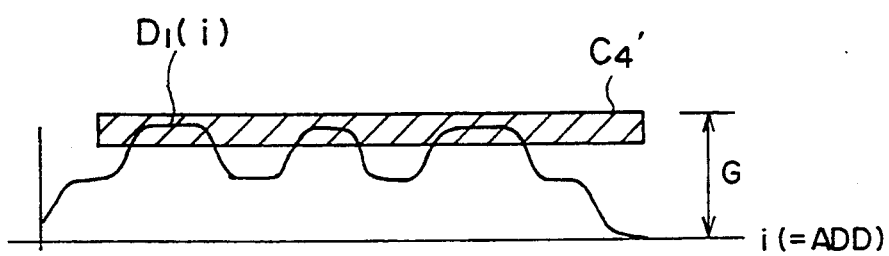

Referring to FIG. 21 showing the patterns for the data $D_1(i)$ and $D_2(i)$ in an enlarged scale, it will be noted that the pattern for the data $D_1(i)$ has a steeper slope as compared with the pattern for the data $D_2(i)$ because of the difference in the gain. The data $D_1(i)$ is obtained with a gain G1 that is larger than a predetermined gain G2 for the data $D_2(i)$ as indicated in FIGS. 22(A) and 22(B), wherein FIG. 22(A) shows that the data $D_2(i)$ is obtained with the gain G2 while FIG. 22(B) shows that the data $D_1(i)$ is obtained with the gain G1.

As a result of the difference in the gain and hence the slope, there appears an apparent offset in the position of the pattern as shown in FIG. 21 when the pattern for the data $D_1(i)$ and the pattern for the data $D_2(i)$ are compared with each other at the same level. In order to achieve the proper comparison of the patterns with respect to the position, it is necessary and desired to compensate for the deviation of the gain G1 with respect to the gain G2 such that the top level of the pattern $D_2(i)$ indicated by a shadowed region C4 in FIG. 22(A) coincides with the top level of the pattern $D_1(i)$ indicated also by a shadowed region C4' of FIG. 22(B).

Figure 23:
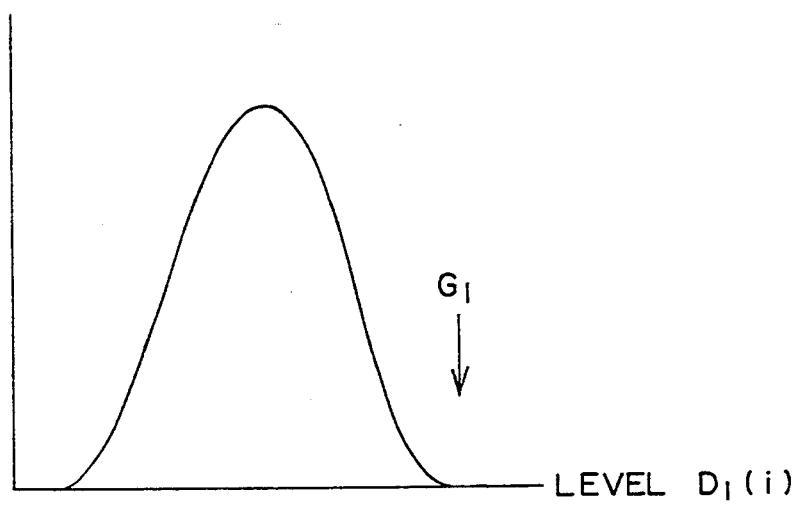
FIG. 23 is a diagram showing the histogram used in the third embodiment of the present invention.

In order to detect the gain G1 from the pattern $D_1(i)$, one may evaluate the frequency of occurrence of data $D_1(i)$ in the form of histogram as indicated in FIGS. 23. In the histogram of FIGS. 23, the gain G1 is obtained for example based upon the range of the data $D_1$ for the top 5–10% of the population. Based upon the gain G1 thus detected with respect to the predetermined gain G2, the pattern for the data $D_1(i)$ is compensated for with respect to the pattern for the data $D_2(i)$.

Figure 24:
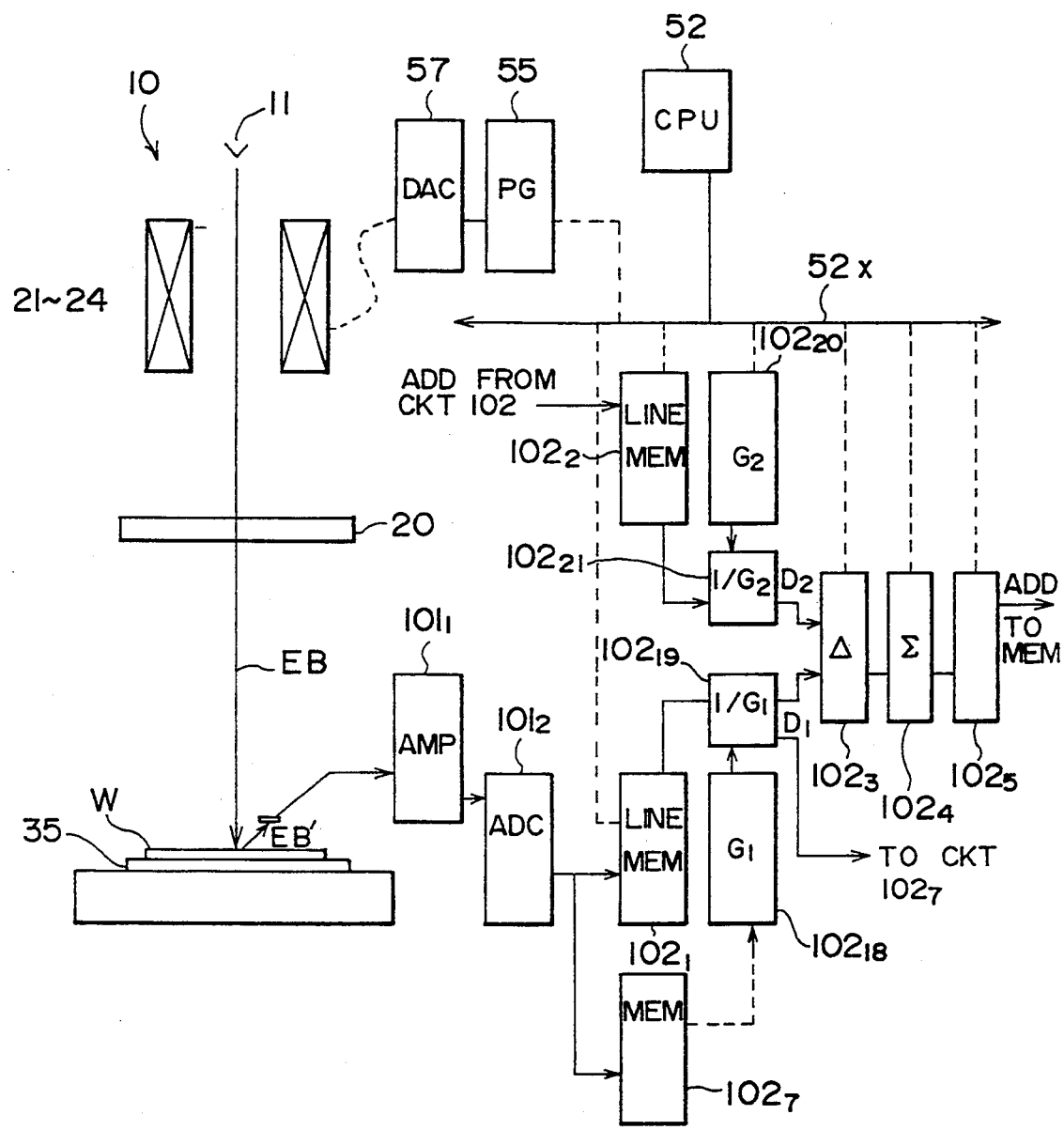
FIG. 24 is a block diagram showing the construction of the electron beam exposure used in the third embodiment of the present invention.

FIG. 24 shows the construction of the electron beam exposure system used in the third embodiment, wherein those parts correspond to the parts described previously are designated by the corresponding reference numerals and the description thereof will be omitted. Further, it should be noted that the circuit of FIG. 24 cooperates with a circuit identical with the circuit of FIG. 11(B) although not illustrated.

Referring to FIG. 24, there is provided a memory $102_{17}$ that calculates and stores the histogram shown in FIGS. 23. Thereby, the peak position G1 of the histogram stored in the memory $102_{17}$ is read out and stored in a register $102_{18}$, and the register $102_{18}$ controls a multiplier circuit $102_{19}$ that multiplies a predetermined multiplication factor to the pattern data read out from the line memory $102_1$, such that the multiplication factor is set to 1/G1. On the other hand, the register $102_{20}$ holds therein the predetermined gain G2. The register $102_{20}$ in turn controls a multiplier circuit $102_{21}$ such that the multiplication factor in the circuit $102_{21}$ is set to a predetermined value of 1/G2. Thereby, the data $D_1(i)$ and $D_2(i)$ are normalized such that any difference in the gain is eliminated. By applying the pattern matching process to the data $D_1(i)$ and data $D_2(i)$ thus processed, one can achieve a reliable and exact pattern matching. Thereby, the accuracy for detecting the anomaly in the beam shaping aperture on the block mask 20 is also improved substantially.

Further, the present invention is not limited to the embodiments described heretofore, but various variations and modifications may be made without departing from the scope of the invention.

What is claimed is:

1. A charged particle beam exposure system for exposing a pattern on an object by a shaped charged particle beam, comprising:
   beam source means for producing a charged particle beam and radiating the same toward said object along an optical axis;
   beam shaping means provided on said optical axis between said beam source means and said object for shaping said charged particle beam to produce a shaped charged particle beam, said beam shaping means comprising a mask for interrupting said charged particle beam and apertures provided on said mask for passing said charged particle beam, said apertures thereby shaping said charged particle beam according to a shape of said apertures to produce said shaped charged particle beam;
   deflection means for deflecting said charged particle beam so as to direct same through a selected beam shaping aperture on said beam shaping mask;
   focusing means for focusing said shaped charged particle beam upon said object with demagnification;
   a marker pattern provided on a surface of said object for reflecting said shaped charged particle beam that is radiated upon said object, with a rate different from the rest of the surface of said object;
   control means for scanning said marker pattern by said shaped charged particle beam along a scanning path;
   detection means for detecting reflected charged particles that are reflected from the surface of said object;
   storage means for storing an expected pattern of reflected charged particles that would be emitted from said object when said marker pattern is scanned by said shaped charged particle beam along said scanning path;
   difference means for calculating a difference between a first pattern representative of a pattern of said reflected charged particles detected by said detection means upon scanning of said marker pattern by said charged particle beam along said scanning path and a second pattern representative of said expected pattern of said reflected charged particles stored in said storage means, said difference means producing difference data indicative of the amount of said difference;
   pattern matching means supplied with said difference data for minimizing the amount of said difference by shifting said first pattern with respect to said second pattern along said scanning path; and
   anomaly detection means supplied with said difference from said difference data means for evaluating the magnitude of a residual difference indicative of the amount of said difference a minimized by said pattern matching means, said anomaly detection means producing an alarm signal when the magnitude of said residual difference has exceeded a threshold value.

2. A charged particle beam exposure system as claimed in claim 1, wherein said difference means comprises: first memory means for storing first data indicative of said first pattern at respective addresses; and second memory means for storing second data indicative of said second pattern at respective addresses, wherein each address of said first memory means corresponds to a point located on said scanning path; and subtracter means for subtracting, in each address of said first memory means and in a corresponding address of said second memory means, said second data stored in said second memory means from said first data stored in said first memory means thereby to produce said difference data in correspondence to said address in said first and second memory means.

3. An electron beam exposure system as claimed in claim 2, wherein said pattern matching means comprises: accumulation means supplied with said difference data from said difference means for each address of said first and second memory means for summing the same, said accumulation means thereby producing an evaluation function indicative of a sum of said difference data; and address shifting means for shifting said address of said second memory means with respect to said address of said first memory means; wherein said pattern matching means seeks for the minimum of said evaluation function while shifting said address of said second memory means with respect to said address of said first memory means.

4. A method for exposing a pattern on an object by means of a focused charged particle beam, comprising the steps of:
   producing a charged particle beam such that said charged particle beam travels toward said object along an optical path;
   shaping said charged particle beam to form a shaped charged particle beam having a selected beam shape by passing said charged particle beam through a selected beam shaping aperture provided on a mask;
   focusing said shaped charged particle beam upon said object;
   causing a scanning of said shaped charged particle beam over a marker pattern provided on said object along a scanning path, said scanning path crossing said marker pattern;
   detecting reflected electrons, reflected from said object, while scanning said marker pattern by said charged particle beam along said scanning path;
   obtaining a first pattern indicative of a pattern of said reflected electrons obtained in said step of detecting reflected electrons along said scanning path;
   obtaining a second pattern indicative of a pattern of reflected electrons that is expected when said shaped charged particle scans said marker pattern along said scanning path;
   calculating an evaluation function indicative of an area wherein said first and second patterns do not overlap with each other, by comparing said first and second patterns;
   minimizing said evaluation function by shifting said second pattern with respect to said first pattern along said scanning path;
   calculating a difference between said first and second patterns for said first and second patterns that are shifted with each other thereby to minimize said evaluation function; and
   issuing an alarm when said difference has exceeded a predetermined threshold.

5. A method as claimed in claim 4, wherein said step of minimizing said evaluation function comprises the step of repeatedly carrying out the step of calculating the evaluation function while, for each time, shifting said second pattern with respect to said first pattern along said scanning path.

6. A method as claimed in claim 5, wherein said step of calculating the evaluation function comprises a step of calculating a quantity $$K[\pm j] = \Sigma |D_1(i) - D_2(i \pm j)|$$

wherein $K[\pm j]$ represents the evaluation function, $D_1(i)$ represents pattern data for said first pattern, $D_2$ represents pattern data for said second pattern, i represents an index indicative of a position on said scanning path, and j represents an index indicative of a shift of said second pattern with respect to said first pattern.

7. A method as claimed in claim 6, wherein said step of minimizing the evaluation function seeks the minimum of said evaluation function $K[\pm j]$ while changing the index j.

8. A method as claimed in claim 7, wherein said step of minimizing the evaluation function comprises a process for fitting a relationship between said evaluation function $K[\pm j]$ and the index by two intersecting linear equations and obtaining an intersection of the linear equations thus obtained.

9. A method as claimed in claim 4, wherein said step of calculating the difference between said first and second patterns comprises a step of calculating a quantity $$B(i) = |D_1(i) - D_2'(i)|$$

for each index i indicative of the position on said scanning path, and wherein said step of issuing the alarm comprises the step of comparing the quantity B(i) with respect to a threshold for each index i, and setting a flag indicative of an anomaly when said threshold has been exceeded, said flag carrying said index i for indicating the location of said shaped charged particle beam wherein the anomaly exists.

10. A method as claimed in claim 4, wherein said step of minimizing the evaluation function comprises the step of obtaining an offset of said charged particle beam with respect to an expected beam position according to a relationship of $$\epsilon = j \times p,$$

wherein $\epsilon$ represents the magnitude of offset of said charged particle beam, j represents the number of times said second pattern is shifted with respect to said first pattern to minimize said evaluation function, and p represents a pitch for shifting said second pattern with respect to said first pattern.

11. A method as claimed in claim 4, wherein said step of issuing the alarm comprises a step of comparing the magnitude of said evaluation function with a threshold, such that the alarm is issued when said threshold is exceeded.

12. A method as claimed in claim 4, wherein said step of obtaining the first pattern comprises a step of detecting reflected charged particles emitted when said marker pattern is scanned by said charged particle beam.

13. A method as claimed in claim 12, wherein said step of obtaining the first pattern comprises a step of detecting said reflected charged particles with a first gain, said step of obtaining the second pattern comprises a step of calculating said second pattern based upon a second gain, and wherein said method further comprises a step of compensating for a difference between said first and second gains such that said first and second patterns are obtained with the same gain, said step of compensating for the gain comprising a step of deducing the first gain by evaluating a histogram of intensity of said reflected charged particles, and deducing the first gain based upon said histogram.

14. A method as claimed in claim 4, wherein said step of minimizing the evaluation function comprises the steps of differentiating said first and second patterns to produce respective first and second differential patterns, selecting a first predominant peak pattern in said first differential pattern and a corresponding second predominant peak pattern in said second differential pattern, calculating a positional difference between said first and second predominant peak patterns thereby to evaluate a coarse amount of said shifting of second pattern with respect to said first pattern, shifting said second pattern with respect to said first pattern by said coarse amount of shifting, and seeking the minimum of said evaluation function while shifting said second pattern with respect to said first pattern with a predetermined pitch that is substantially smaller than said coarse amount of shifting.

* * * * *

UNITED STATES PATENT AND TRADEMARK OFFICE
CERTIFICATE OF CORRECTION

PATENT NO. : 5,404,019
DATED : April 4, 1995
INVENTOR(S) : OHNO et al.

It is certified that error appears in the above-indentified patent and that said Letters Patent is hereby corrected as shown below:

Col. 12, line 20, change the equation to read:

$$K[\pm j] = \Sigma |D_1(i) - D_2(i \pm j)|, \quad i=1,2,\ldots,$$

Col. 17, line 56, after "ence" insert --data--; and delete "data"; line 58, change "a" to --as--. (first occ.).

Col. 19, line 29, change the equation to read:

$$B(i) = |D_1(i) - D_2(i)|$$

* Col. 20, line 39, delete "said" and after "shifting of" insert --said-- (2nd. occ.).

Signed and Sealed this

Twenty-eighth Day of November 1995

Attest:

BRUCE LEHMAN

*Attesting Officer*      *Commissioner of Patents and Trademarks*